US012793798B2

(12) United States Patent
Chai et al.

(10) Patent No.: US 12,793,798 B2
(45) Date of Patent: *Nov. 10, 2026

(54) PAGE BUFFER, SEMICONDUCTOR MEMORY HAVING THE SAME, AND OPERATING METHOD OF THE SEMICONDUCTOR MEMORY

(71) Applicant: SK hynix Inc., Icheon-si (KR)

(72) Inventors: Soo Yeol Chai, Icheon-si (KR); Jong Woo Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 84 days.

This patent is subject to a terminal disclaimer.

(21) Appl. No.: 18/768,518

(22) Filed: Jul. 10, 2024

(65) Prior Publication Data

US 2024/0363180 A1 Oct. 31, 2024

Related U.S. Application Data

(62) Division of application No. 17/487,705, filed on Sep. 28, 2021, now Pat. No. 12,062,403.

(30) Foreign Application Priority Data

Apr. 8, 2021 (KR) ........................ 10-2021-0045960

(51) Int. Cl.

| | |
|---|---|
| ***G11C 16/34*** | (2006.01) |
| ***G11C 7/10*** | (2006.01) |
| ***G11C 16/10*** | (2006.01) |
| ***G11C 16/24*** | (2006.01) |
| ***G11C 16/26*** | (2006.01) |

(52) U.S. Cl.

CPC ........ *G11C 16/3459* (2013.01); *G11C 7/1039* (2013.01); *G11C 16/102* (2013.01); *G11C 16/24* (2013.01); *G11C 16/26* (2013.01); *G11C 16/3404* (2013.01)

(58) Field of Classification Search

CPC .......................... G11C 7/1039; G11C 16/3459

USPC .................................................... 365/185.22

See application file for complete search history.

(56) References Cited

U.S. PATENT DOCUMENTS

| | | | | |
|---|---|---|---|---|
| 10,846,229 | B1 | 11/2020 | Choi et al. | |
| 2008/0285341 | A1* | 11/2008 | Moschiano ........ | G11C 16/3418 365/185.25 |
| 2009/0003084 | A1 | 1/2009 | Kim et al. | |

(Continued)

FOREIGN PATENT DOCUMENTS

| | | |
|---|---|---|
| CN | 111199765 A | 5/2020 |
| CN | 113948123 A | 1/2022 |

(Continued)

*Primary Examiner* — Anthan Tran

(74) *Attorney, Agent, or Firm* — WILLIAM PARK AND ASSOCIATES LTD.

(57) ABSTRACT

A page buffer includes a bit line controller connected between a bit line and a sensing node, wherein the bit line controller is capable of adjusting a potential level of the sensing node, based on a cell current amount of the bit line, by performing an evaluation operation. The page buffer also includes a first latch unit connected to the sensing node, wherein the first latch unit is capable of adjusting an operation period of the evaluation operation. The page buffer further includes a second latch unit for latching verify data, based on the potential level of the sensing node.

8 Claims, 20 Drawing Sheets

(56) References Cited

U.S. PATENT DOCUMENTS

| | | | |
|---|---|---|---|
| 2018/0137900 A1 | 5/2018 | Kim et al. | |
| 2020/0381055 A1 | 12/2020 | Ko et al. | |
| 2020/0387453 A1 | 12/2020 | Choi et al. | |
| 2021/0295927 A1 | 9/2021 | Park et al. | |
| 2021/0391000 A1* | 12/2021 | Lee | G11C 16/0483 |
| 2021/0398595 A1 | 12/2021 | Lim et al. | |
| 2022/0020404 A1* | 1/2022 | Cho | G11C 7/106 |

FOREIGN PATENT DOCUMENTS

| | | |
|---|---|---|
| KR | 1020100065512 A | 6/2010 |
| KR | 101046805 B1 | 7/2011 |
| KR | 1020190079112 A | 7/2019 |

* cited by examiner

PAGE BUFFER, SEMICONDUCTOR MEMORY HAVING THE SAME, AND OPERATING METHOD OF THE SEMICONDUCTOR MEMORY

CROSS-REFERENCE TO RELATED APPLICATION

The present application is a divisional application of U.S. patent application Ser. No. 17/487,705, filed on Sep. 28, 2021, which claims priority under 35 U.S.C. § 119(a) to Korean patent application number 10-2021-0045960, filed on Apr. 8, 2021, in the Korean Intellectual Property Office, the entire contents of which applications are incorporated herein by reference.

BACKGROUND

1. Technical Field

The present disclosure generally relates to an electronic device, and more particularly, to a page buffer, a semiconductor memory having the same, and an operating method of the semiconductor memory.

2. Related Art

A semiconductor memory device is a memory device implemented using a semiconductor such as silicon (Si), germanium (Ge), gallium arsenide (GaAs), or indium phosphide (InP). Semiconductor memory devices may be generally classified as volatile memory devices or nonvolatile memory devices.

A volatile memory device is a memory device in which stored data is lost when the supply of power is interrupted. Volatile memory devices include, for example, Static Random Access Memory (SRAM), Dynamic RAM (DRAM), Synchronous DRAM (SDRAM), and the like. A nonvolatile memory device is a memory device in which stored data is retained even when the supply of power is interrupted. Nonvolatile memory devices include, for example, Read Only Memory (ROM), Programmable ROM (PROM), Electrically Programmable ROM (EPROM), Electrically Erasable and Programmable ROM (EEPROM), flash memory, Phase-change RAM (PRAM), Magnetic RAM (MRAM), Resistive RAM (RRAM), Ferroelectric RAM (FRAM), and the like. Flash memory is generally classified as NOR-type flash memory or NAND-type flash memory.

SUMMARY

Some embodiments are directed to a page buffer capable of improving the threshold voltage distribution and program time of memory cells, a semiconductor memory having the page buffer, and an operating method of the semiconductor memory.

In accordance with an embodiment of the present disclosure is a page buffer including: a bit line controller connected between a bit line and a sensing node, the bit line controller capable of adjusting a potential level of the sensing node, based on a cell current amount of the bit line, by performing an evaluation operation; a first latch unit connected to the sensing node, the first latch unit capable of adjusting an operation period of the evaluation operation; and a second latch unit configured to latch verify data, based on the potential level of the sensing node.

In accordance with another embodiment of the present disclosure is a page buffer including: a bit line controller connected between a bit line and a sensing node, the bit line controller capable of adjusting a potential level of the sensing node, based on a cell current amount of the bit line, by performing an evaluation operation; a first latch unit connected to the sensing node, the first latch unit capable of latching specific data for adjusting an operation period of the evaluation operation; and a second latch unit configured to latch verify data, based on the potential level of the sensing node. The bit line controller is capable of adjusting the operation period of the evaluation operation, based on the specific data latched by the first latch unit.

In accordance with still another embodiment of the present disclosure is a semiconductor memory including: a memory block including a plurality of pages; and a read/write circuit including a plurality of page buffers connected to bit lines of the memory block. The plurality of page buffers is capable of storing previous program data of a page programmed in a just previous program operation or specific data, and adjusting an evaluation period in a program verify operation of a currently selected page, based on the previous program data or the specific data.

A method for operating a semiconductor memory in accordance with the present disclosure includes: storing, in a first latch unit of a page buffer, previous program data stored in a previous page which is adjacent to a selected page among a plurality of pages and which has been programmed in a just previous program operation or specific data; storing data to be programmed in the selected page in a second latch unit of the page buffer; adjusting a potential level of bit lines connected to the selected page, based on the data stored in the second latch unit and then performing a program voltage apply operation; and performing an evaluation operation of adjusting a potential level of a sensing node of the page buffer, based on a current amount of the bit lines, and then performing a program verify operation of latching verify data corresponding to the potential level of the sensing node, wherein the evaluation operation is performed during an evaluation period set as a first evaluation period or a second evaluation period shorter than the first evaluation period, based on the previous program data or the specific data, which is stored in the first latch unit.

Another method for operating a semiconductor memory in accordance with the present disclosure includes: performing a foggy program operation on a first page, wherein an evaluation operation of adjusting a potential level of a sensing node of a page buffer, based on a current amount of a bit line in a program verify operation of the foggy program operation is performed during a first evaluation period; performing the foggy program operation on a second page adjacent to the first page; and performing a fine program operation on the first page, wherein the evaluation operation in the program verify operation of the fine program is performed during a second evaluation period longer than the first evaluation period.

Another method for operating a semiconductor memory in accordance with the present disclosure includes: storing program data to be programmed in a selected page in a page buffer; adjusting a potential of a bit line, based on the program data; applying a program voltage to a word line corresponding to the selected page; performing a pre-verify operation with a pre-threshold voltage level lower than a target threshold voltage level, wherein an evaluation operation of the pre-verify operation is performed in a first evaluation period; and performing a main verify operation with the target threshold voltage level, wherein the evaluation operation of the main verify operation is performed in a second evaluation period longer than the first evaluation period.

Another method for operating a semiconductor memory in accordance with the present disclosure includes: storing specific data in a first latch unit of a page buffer, and storing program data to be programmed in a memory cell in a second latch unit of the page buffer; applying a program allow voltage or a program inhibit voltage to a bit line connected to the memory cell, based on the program data; applying a program voltage to a word line connected to the memory cell; and sequentially performing a verify operation corresponding a first program state and a verify operation corresponding to a second program in a state in which one program verify voltage is applied to the word line.

BRIEF DESCRIPTION OF THE DRAWINGS

Example embodiments will now be described more fully hereinafter with reference to the accompanying drawings; however, they may be embodied in different forms and should not be construed as being limited to the embodiments set forth herein. Rather, these embodiments are provided so that this disclosure will be enabling to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional descriptions disclosed herein are merely illustrative for the purpose of describing embodiments according to the concept of the present disclosure. The embodiments according to the concept of the present disclosure can be implemented in various forms, and should not be construed as being limited to the embodiments set forth herein.

Hereinafter, embodiments of the present disclosure will be described in detail with reference to the accompanying drawings in order for those skilled in the art to be able to implement the technical spirit of the present disclosure.

Figure 1:
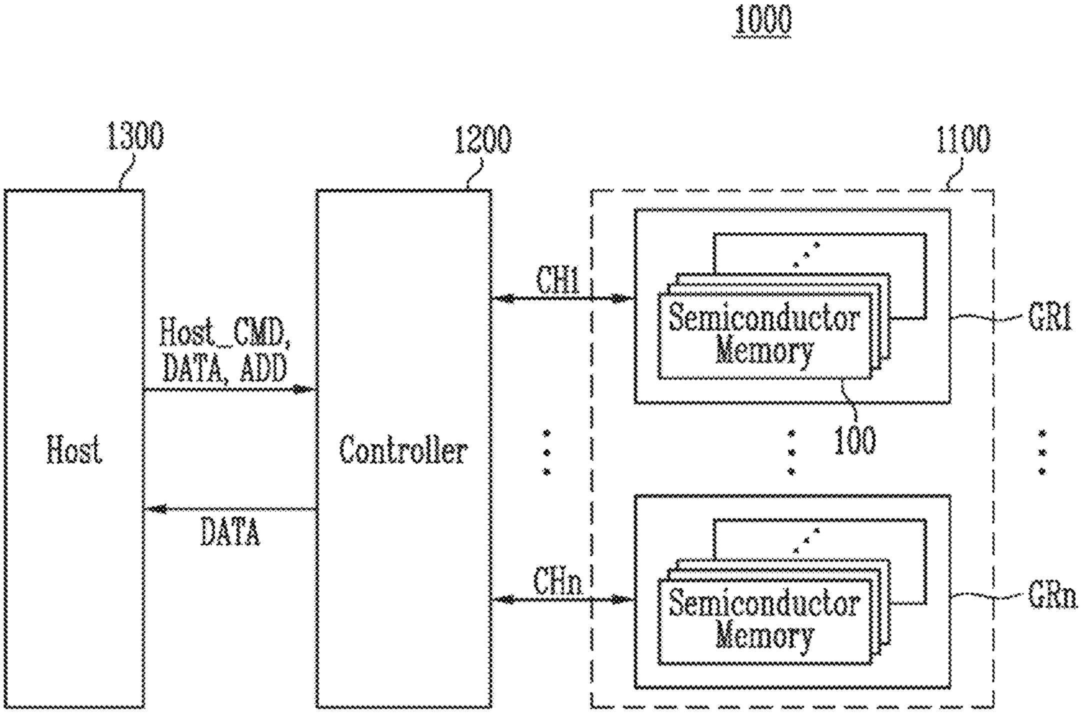
FIG. 1 is a block diagram illustrating a memory system including a memory device in accordance with an embodiment of the present disclosure.

FIG. 1 is a block diagram illustrating a memory system including a memory device in accordance with an embodiment of the present disclosure.

Referring to FIG. 1, the memory system 1000 includes a memory device 1100, a controller 1200, and a host 1300. The memory device 1100 includes a plurality of semiconductor memories 100. The plurality of semiconductor memories 100 may be divided into a plurality of groups GR1 to GRn. Although a case where the host 1300 is included in the memory system 1000 is illustrated and described in the embodiment of the present disclosure, the memory system 1000 may include only the controller 1200 and the memory device 1100, and the host 1300 may be disposed outside of the memory system 1000.

In FIG. 1, it is illustrated that the plurality of groups GR1 to GRn of the memory device 1100 communicate with the controller 1200 respectively through first to nth channels CH1 to CHn. Each semiconductor memory 100 will be described later with reference to FIG. 2.

Each of the plurality of groups GR1 to GRn communicates with the controller 1200 through one common channel. The controller 1200 controls the plurality of semiconductor memories 100 of the memory device 1100 through the plurality of channels CH to CHn.

The controller 1200 is coupled between the host 1300 and the memory device 1100. The controller 1200 accesses the memory device 1100 in response to a request from the host 1300. For example, the controller 1200 controls read, program, erase, and background operations of the memory device 1100 in response to a host command Host_CMD received from the host 1300. In a program operation, the host 1300 may transmit an address ADD and data DATA to be programmed together with the host command Host_CMD. In a read operation, the host 1300 may transmit an address ADD together with the host command Host_CMD. In a program operation, the controller 1200 may transmit a command corresponding to the program operation and data DATA to be programmed to the memory device 1100. In a read operation, the controller 1200 may transmit a command corresponding to the read operation to the memory device 1100, receive read data DATA from the memory device 1100, and transmit the received data DATA to the host 1300. The controller 1200 provides an interface between the memory device 1100 and the host 1300. The controller 1200 drives firmware for controlling the memory device 1100.

The host 1300 includes portable electronic devices such as a computer, a PDA, a PMP, an MP3 player, a camera, a camcorder, and a mobile phone. The host 1300 may request a program operation, a read operation, an erase operation, etc. of the memory system 1000 through a host command Host_CMD. For the purpose of a program operation, the host 1300 may transmit a host command Host_CMD corresponding to the program operation, data DATA, and an address ADD to the controller 1200. For the purpose of a read operation, the host may transmit a host command Host_CMD corresponding to the read operation and an address ADD to the controller 1200. The address ADD may be a logical address block of data.

The controller 1200 and the memory device 1100 may be integrated into one semiconductor memory. In an embodiment, the controller 1200 and the memory device 1100 may be integrated into one semiconductor memory, to constitute a memory card. For example, the controller 1200 and the memory device 1100 may be integrated into one semiconductor memory, to constitute a memory card such as a PC card (Personal Computer Memory Card International Association (PCMCIA)), a Compact Flash (CF) card, a Smart Media Card (SM or SMC), a memory stick, a Multi-Media Card (MMC, RS-MMC or MMCmicro), an SD card (SD, miniSD, microSD or SDHC), or a Universal Flash Storage (UFS).

In another example, the memory system 1000 may be one of various components of an electronic device such as a computer, an Ultra Mobile PC (UMPC), a workstation, a net-book, a Personal Digital Assistant (PDA), a portable computer, a web tablet, a wireless phone, a mobile phone, a smart phone, an e-book, a Portable Multi-Media Player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an embodiment, the memory device 1100 or the memory system 1000 may be packaged in various forms. For example, the memory device 1100 or the memory system 1000 may be packaged as a Package On Package (PoP), Ball Grid Array (BGA), Chip Scale Package (CSP), Plastic Leaded Chip Carrier (PLCC), Plastic Dual In-line Package (PDIP), die in Waffle pack, die in wafer form, Chip On Board (COB), CERamic Dual In-line Package (CERDIP), Plastic Metric Quad Flat Pack (PMQFP), Thin Quad Flat Pack (TQFP), Small Outline Integrated Circuit (SOIC), Shrink Small Outline Package (SSOP), Thin Small Outline Package (TSOP), System In Package (SIP), Multi-Chip Package (MCP), Wafer-level Fabricated Package (WFP), or Wafer-level processed Stack Package (WSP).

Figure 2:
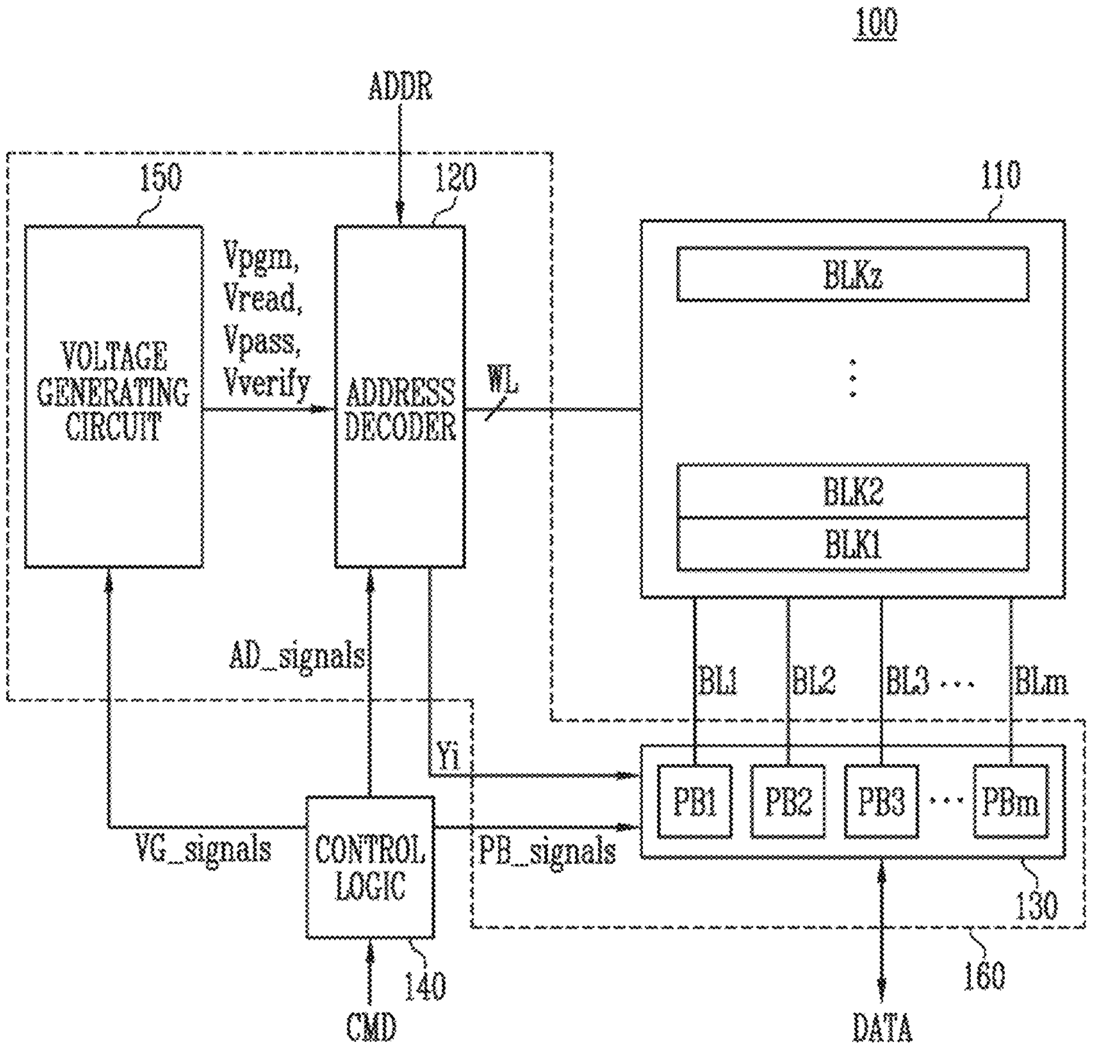
FIG. 2 is a diagram illustrating a semiconductor memory included in the memory device shown in FIG. 1.

FIG. 2 is a diagram illustrating the semiconductor memory included in the memory device 1100 shown in FIG. 1.

Referring to FIG. 2, the semiconductor memory 100 includes a memory cell array 110, an address decoder 120, a read/write circuit 130, control logic 140, and a voltage generating circuit 150. The address decoder 120, the read/write circuit 130, and the voltage generating circuit 150 may be defined as a peripheral circuit 160 which performs a read operation on the memory cell array 110.

The memory cell array 110 includes a plurality of memory blocks BLK1 to BLKz. The plurality of memory blocks BLK1 to BLKz are coupled to the address decoder 120 through word lines WL. The plurality of memory blocks BLK1 to BLKz are coupled to the read/write circuit 130 through bit lines BL1 to BLm. Each of the plurality of memory blocks BLK1 to BLKz includes a plurality of memory cells. In an embodiment, the plurality of memory cells may be nonvolatile memory cells. A plurality of memory cells coupled to one word line among the plurality of memory cells may be defined as one page. That is, the memory cell array 110 may be configured with a plurality of pages.

Each of the plurality of memory blocks BLK1 to BLKz of the memory cell array 110 includes a plurality of memory strings. Each of the plurality of memory strings includes a drain select transistor, a plurality of memory cells, and a source select transistor, which are coupled in series between a bit line and a source line. Also, each of the plurality of memory strings may include a pass transistor between the source select transistor and the memory cells and a pass transistor between the drain select transistor and the memory cells, and further include a pipe gate transistor between the memory cells. The memory cell array 110 will be described in detail later.

The address decoder 120 is coupled to the memory cell array 110 through the word lines WL. The address decoder 120 operates in response to address decoder control signals AD_signals generated by the control logic 140. The address decoder 120 receives an address ADDR through an input/output buffer (not shown) in the semiconductor memory 100.

The address decoder 120 may decode a row address in the received address ADD, and apply a plurality of operation voltages including a program voltage Vpgm, a read voltage Vread, a pass voltage Vpass, and a verify voltage Vverify, which are generated by the voltage generating circuit 150 during the program or read operation, to a plurality of memory cells of the memory cell array 110 according to the decoded row address.

The address decoder 120 decodes a column address in the received address ADDR. The address decoder 120 transmits the decoded column address Yi to the read/write circuit 130.

An address ADDR received in the program operation or the read operation includes a block address, a row address, and a column address. The address decoder 120 selects one memory block and one word line according to the block address and the row address. The column address is decoded by the address decoder 120 to be provided to the read/write circuit 130.

The address decoder 120 may include a block decoder, a row decoder, a column decoder, an address buffer, and the like.

The read/write circuit 130 includes a plurality of page buffers PB1 to PBm. The plurality of page buffers PB1 to PBm are coupled to the memory cell array 110 through the bit lines BL1 to BLm. The plurality of page buffers PB1 to PBm may perform a data sensing operation of sensing a program state of memory cells connected to the bit lines BL1 to BLm in a read operation or a program verify operation. In the data sensing operation, each of the plurality of page buffers PB1 to PBm may latch data, based on a current amount of a corresponding bit line among the bit lines BL1 to BLm. The plurality of page buffers PB1 to PBm may perform a data transmission operation of receiving data to be programmed in a program operation and temporarily storing the received data, and adjust the potential level of a corresponding bit line among the bit lines BL1 to BLm, based on the temporarily stored data.

Each of the plurality of page buffers PB1 to PBm may control a cell current amount flowing through a bit line by adjusting an evaluation period in the data sensing operation during the read operation or the program verify operation. Accordingly, program verify operations corresponding to a plurality of program states or a plurality of threshold voltage levels may be performed by applying one read voltage or one verify voltage to a word line to which memory cells are connected. That is, each of the plurality of page buffers PB1 to PBm may adjust the cell current amount by adjusting the evaluation period in the data sensing operation. Therefore, each of the plurality of page buffers PB1 to PBm may perform a data sensing operation such as an operation of adjusting the read voltage or the verify voltage, which is applied to the word line.

Each of the plurality of page buffers PB1 to PBm may temporarily store data programmed in a page of which a program operation has been completed, which is adjacent to a selected page in the program operation, and set an evaluation period in a program verify operation of the selected page.

Also, each of the plurality of page buffers PB1 to PBm may receive and temporarily store specific data for setting the evaluation period, and set the evaluation period in the program verify operation of the selected page, based on the temporarily stored specific data.

The read/write circuit 130 operates in response to page buffer control signals PB_signals output from the control logic 140.

In an embodiment, the read/write circuit 130 may include page buffers (or page registers), a column select circuit, and the like.

The control logic 140 is coupled to the address decoder 120, the read/write circuit 130, and the voltage generating circuit 150. The control logic 140 receives a command CMD through the input/output buffer (not shown) of the semiconductor memory 100. The control logic 140 controls a general operation of the semiconductor memory 100 in response to the command CMD. For example, the control logic 140 receives a command CMD corresponding to a program command, and generates and outputs address decoder control signals AD_signals for controlling the address decoder 120, page buffer control signals PB_signals for controlling the read/write circuit 130, and voltage generating circuit control signals VG_signals for controlling the voltage generating circuit 150 in response to a received command CMD. Also, the control logic 140 receives a command corresponding to a read operation, and generates and outputs address decoder control signals AD_signals for controlling the address decoder 120, page buffer control signals PB_signals for controlling the read/write circuit 130, and voltage generating circuit control signals VG_signals for controlling the voltage generating circuit 150 in response to the received command CMD. The control logic 140 may be implemented as hardware, software, or a combination of hardware and software. For example, the control logic 140 may be a control logic circuit operating in accordance with an algorithm and/or a processor executing control logic code.

The voltage generating circuit 150 may generate the program voltage Vpgm, the pass voltage Vpass, and the verify voltage Vverify and output the generated voltages to the address decoder 120, under the control of the voltage generating circuit control signals VG_signals output from the control logic 140 in a program operation. Also, the voltage generating circuit 150 generates the read voltage Vread and the pass voltage Vpass and outputs the generated voltages to the address decoder 120 under the control of the voltage generating circuit control signals VG_signals output from the control logic 140 in a read operation.

Figure 3:
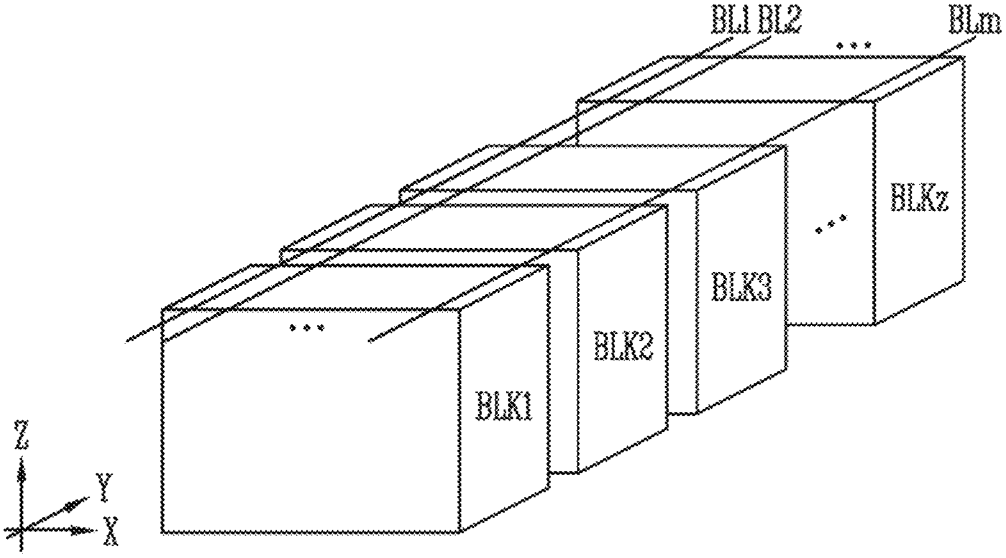
FIG. 3 is a diagram illustrating three-dimensionally configured memory blocks.

FIG. 3 is a diagram illustrating three-dimensionally configured memory blocks.

Referring to FIG. 3, the three-dimensionally configured memory blocks BLK1 to BLKz may be spaced apart from each other along a direction Y in which bit lines BL1 to BLm extend. For example, first to zth memory blocks BLK1 to BLKz may be spaced apart from each other along a second direction Y, and include a plurality of memory cells stacked along a third direction Z. A configuration of any one memory block among the first to zth memory blocks BLK1 to BLKz will be described in detail with reference to FIGS. 4 and 5.

Figure 4:
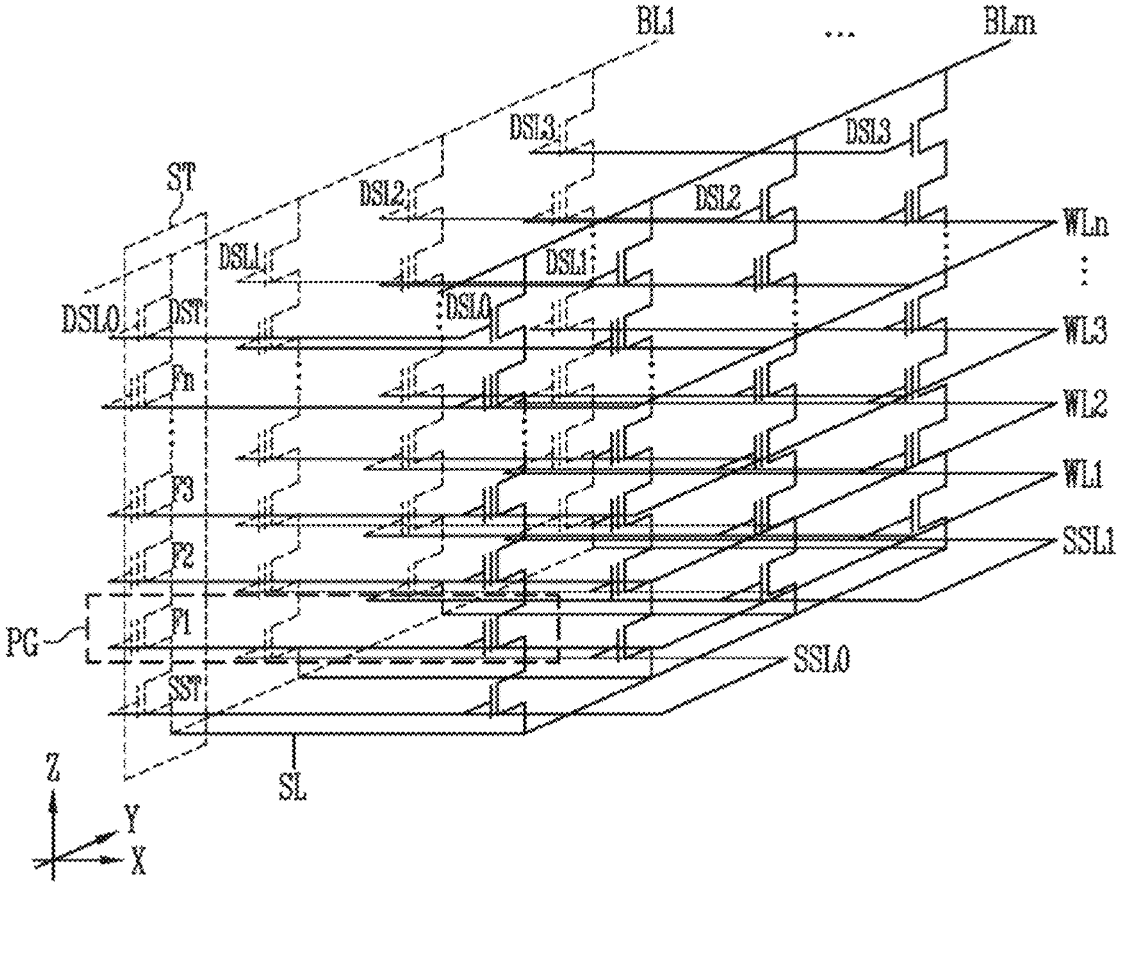
FIG. 4 is a circuit diagram illustrating in detail any one memory block shown in FIG. 3.

FIG. 4 is a circuit diagram illustrating in detail any one memory block shown in FIG. 3.

Figure 5:
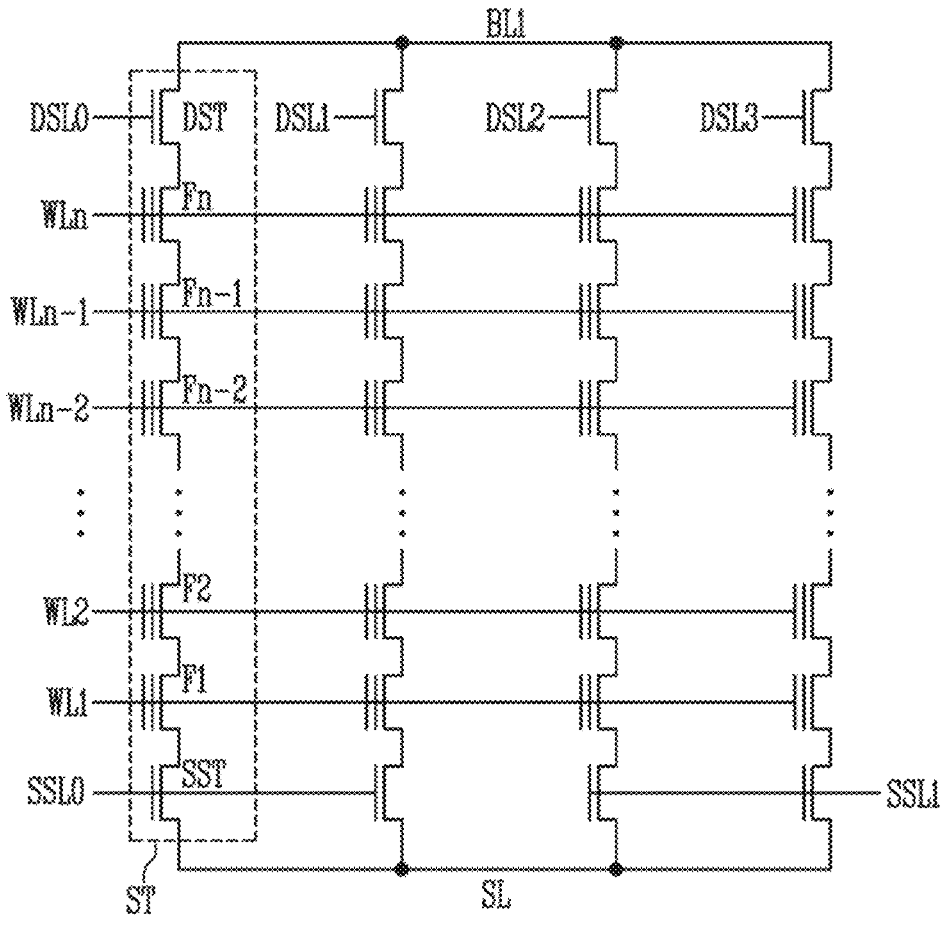
FIG. 5 is a circuit diagram illustrating memory strings shown in FIG. 4.

FIG. 5 is a circuit diagram illustrating memory strings shown in FIG. 4.

Referring to FIGS. 4 and 5, each memory string ST may be coupled between a corresponding bit line among bit lines BL1 to BLm and a source line SL. A memory string ST coupled between a first bit line BL1 and the source line SL will be described as an example.

The memory string ST may include a source select transistor SST, memory cells F1 to Fn (n is a positive integer), and a drain select transistor DST, which are coupled in series between the source line SL and the first bit line BL1. Gates of source select transistors SST included in different memory strings ST coupled to different bit lines BL1 to BLm may be coupled to a first source select line SSL0 and be coupled to a second source select line SSL1. In an example, source select transistors adjacent to each other in the second direction Y among the source select transistors SST may be coupled to the same source select line. For example, when assuming that source select transistors SST are sequentially arranged along the second direction Y, gates of source select transistors SST which are arranged in a first direction X from a first source select transistor SST and are included in different strings ST and gates of source select transistors SST which are arranged in the first direction X from a second source select transistor SST and are included in different strings ST may be coupled to the first source select line SSL0. In addition, gates of source select transistors SST which are arranged in the first direction X from a third source select transistor SST and are included in different strings ST and gates of source select transistors SST which are arranged in the first direction X from a fourth source select transistor SST and are included in different strings ST may be coupled to the second source select line SSL1.

Gates of the memory cells F1 to Fn may be coupled to word lines WL1 to WLn, and gates of drain select transistors DST may be coupled to any one of first to fourth drain select lines DSL0 to DSL3.

Gates of transistors arranged in the first direction X among the drain select transistors DST are commonly coupled to the same drain select line (e.g., DSL0), but transistors arranged in the second direction Y may be coupled to different drain select lines DSL1 to DSL3. For example, when assuming that drain select transistors DST are sequentially arranged along the second direction Y, gates of drain select transistors DST which are arranged in the first direction X from a first drain select transistor DST and are included in different strings ST may be coupled to the first drain select line DSL0. Drain select transistors DST arranged in the second direction Y from the drain select transistors DST coupled to the first drain select line DSL0 may be sequentially coupled to the second to fourth drain select lines DSL1 to DSL3. Therefore, in a selected memory block, memory strings ST coupled to a selected drain select line may be selected, and memory strings ST coupled to the other unselected drain selected lines may be unselected.

Memory cells coupled to the same word line may constitute one page PG. The page may mean a physical page. For example, a group of memory cells coupled in the first direction X to the same word line among the strings ST coupled to the first bit line BL1 to an mth bit line BLm is referred to as a page PG. For example, memory cells arranged in the first direction X among first memory cells F1 coupled to a first word line WL1 may constitute one page PG. Memory cells arranged in the second direction Y among the first memory cells F1 commonly coupled to the first word line WL1 may constitute another page. Therefore, when the first drain select line DSL0 is a selected drain line and the first word line WL1 is a selected word line, a page coupled to the first drain select line DSL0 among a plurality of pages PG coupled to the first word line WL1 becomes a selected page. Pages which are commonly coupled to the first word line WL1 but are coupled to the unselected second to fourth drain select lines DSL1 to DSL3 become unselected pages.

Although a case where one source select transistor SST and one drain select transistor DST are included in one string ST is illustrated in the drawings, a plurality of source select transistors SST and a plurality of drain select transistors DST may be included in one string ST, depending on a semiconductor memory. In addition, dummy cells may be included between the source select transistor SST, the memory cells F1 to Fn, and the drain select transistor DST, depending on a semiconductor memory. The dummy cells do not store user data, like general memory cells F1 to Fn, but may be used to improve electrical characteristics of each string ST. However, the dummy cells are not essential components in this embodiment, and therefore, their detailed descriptions will be omitted.

Figure 6:
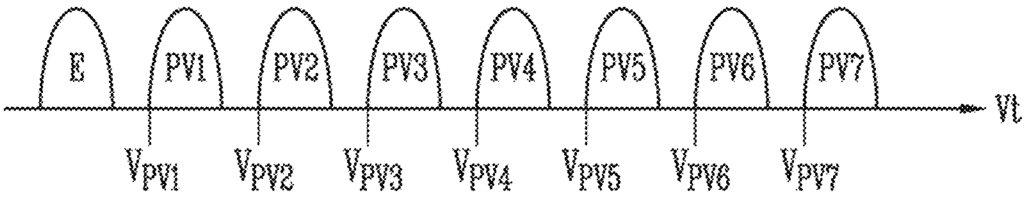
FIG. 6 is a threshold voltage distribution diagram illustrating an erase state and a plurality of program states of memory cells.

FIG. 6 is a threshold voltage distribution diagram illustrating an erase state and a plurality of program states of memory cells.

Each of the memory cells may be a Single-Level Cell (SLC) storing one data bit, a Multi-Level Cell (MLC) storing two data bits, a Triple-Level Cell (TLC) storing three data bits, or a Quad-Level Cell (QLC) storing four data bits. In the embodiment of the present disclosure, program states of TLCs will be described as an example.

A plurality of memory cells included in one page may be programmed to have threshold voltages corresponding to an erase state E and a plurality of program states PV1 to PV7. The erase state E and the plurality of program states PV1 to PV7 may be distinguished from adjacent program states by a plurality of verify voltages $V_{PV1}$ to $V_{PV7}$. For example, a threshold voltage distribution of memory cells corresponding to a first program state PV1 is equal to or higher than the verify voltage $V_{PV1}$ and is lower than the verify voltage $V_{PV2}$. A threshold voltage distribution of memory cells corresponding to a second program state PV2 is equal to or higher than the verify voltage $V_{PV2}$ and is lower than the verify voltage $V_{PV3}$.

Figure 7:
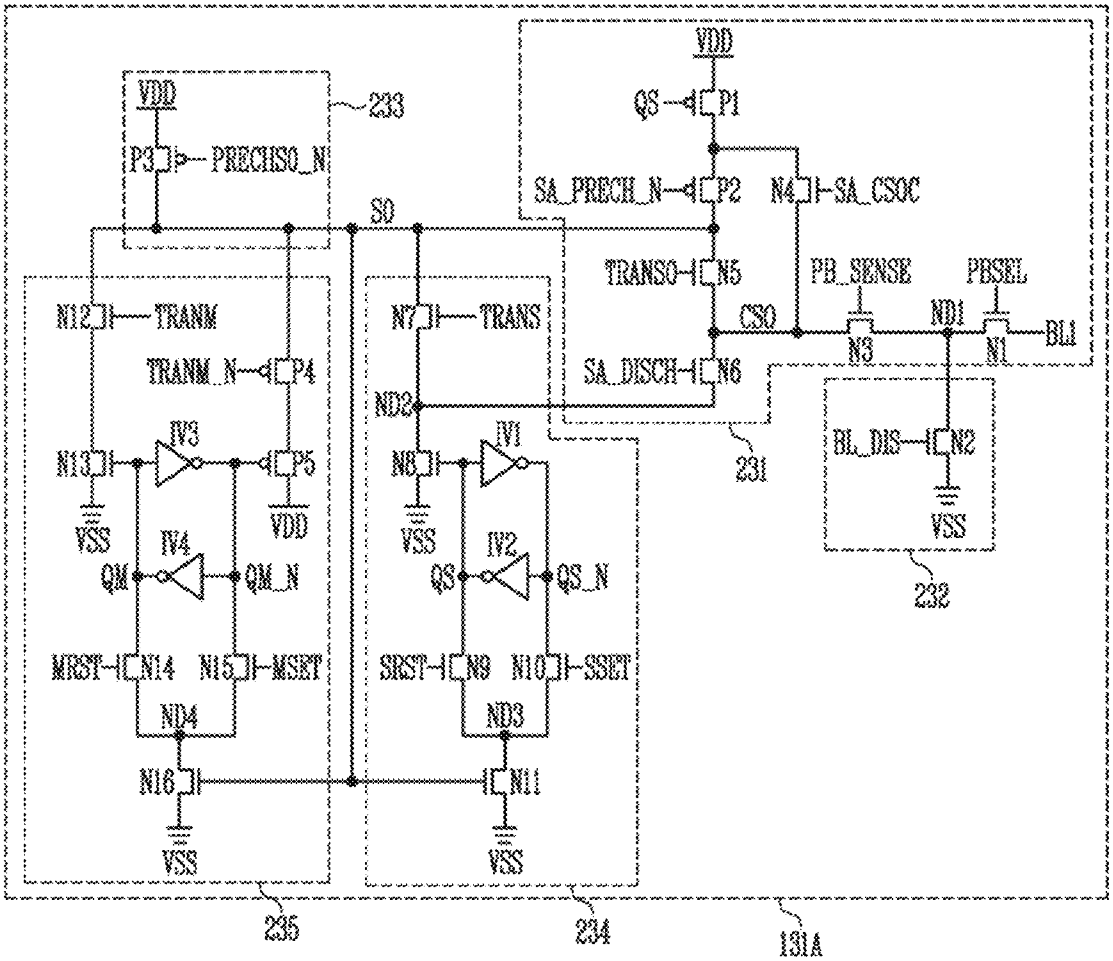
FIG. 7 is a circuit diagram illustrating a page buffer in accordance with an embodiment of the present disclosure.

FIG. 7 is a circuit diagram illustrating a page buffer in accordance with an embodiment of the present disclosure.

The page buffers PB1 to PBm included in the read/write circuit 130 shown in FIG. 2 may have structures similar to one another. In the embodiment of the present disclosure, for convenience of description, a page buffer 131A will be described as an example.

Referring to FIG. 7, the page buffer 131A may include a bit line controller 231, a bit line discharge unit 232, a sensing node precharge unit 233, a first latch unit 235, and a second latch unit 234. The first latch unit 235 may be defined as a main latch unit, and the second latch unit 234 may be defined as a sub-latch unit.

The bit line controller 231 controls a potential level of a sensing node SO, based on a current amount, i.e., a cell current of a bit line BL1, which is changed according to a program state or a threshold voltage of a memory cell connected to the bit line BL1 in a data sensing operation during a read operation or a program verify operation.

The bit line controller 231 may include a plurality of NMOS transistors N1 and N3 to N6 and a plurality of PMOS transistors P1 and P2.

The NMOS transistor N1 is connected between the bit line BL1 and a node ND1, and electrically connects the first bit line BL1 and the node ND1 to each other in response to a page buffer select signal PBSEL.

The NMOS transistor N3 is connected between the node ND1 and a common node CSO, and electrically connects the node ND1 and the common node CSO to each other in response to a page buffer sensing signal PB_SENSE.

The PMOS transistor P1 and the PMOS transistor P2 are connected in series between a power voltage VDD and the sensing node SO, and are turned on respectively in response to a node QS of the sub-latch unit 234 and a precharge signal SA_PRECH_N.

The NMOS transistor N4 is connected between the common node CSO and a node between the PMOS transistor P1 and the PMOS transistor P2, and supplies the power voltage VDD supplied through the PMOS transistor P1 to the common node CSO in response to a control signal SA_CSOC.

The NMOS transistor N5 is connected between the sensing node SO and the common node CSO, and electrically connects the sensing node SO and the common node CSO to each other in response to a transmission signal TRANSO.

The NMOS transistor N6 is connected between the common node CSO and a node ND2 of the sub-latch unit 234, and electrically connects the common node CSO and the node ND2 to each other in response to a discharge signal SA_DISCH.

An operation of the bit line controller 231 in the data sensing operation will be described as follows.

The PMOS transistor P1 and the PMOS transistor P2 precharge the sensing node SO to a level of the power voltage VDD in response the node QS of the second latch unit 234, which is set to a logic low level, and the precharge signal SA_PRECH_N having the logic low level. The NMOS transistor N5 is turned on in response to the transmission signal TRANSO having a logic high level, and the common node CSO is precharged to a certain level VDD−Vth.

Subsequently, an evaluation operation is performed from a time at which the precharge signal SA_PRECH_N is changed to the logic high level to a time at which the transmission signal TRANO is changed to the logic low level. The PMOS transistor P2 is turned off in response to the precharge signal SA_PRECH_N changed to the logic high level, and the power voltage VDD applied to the sensing node SO is interrupted. A potential level of the sensing node SO and the common node CSO is changed according to a program state of the memory cell connected to the bit line BL1. For example, when the memory cell has a program state in which the threshold voltage of the memory cell is higher than a read voltage or a verify voltage, which is applied to a word line of the memory cell in a read or verify operation, no current flows through the bit line BL1. Accordingly, the potential of the common node CSO and the sensing node SO maintains a precharge level. On the other hand, when the memory cell has a state in which the threshold voltage of the memory cell is lower than the read voltage or the verify voltage, which is applied to the word line of the memory cell in the read or verify operation, current flows through the bit line BL1. Accordingly, the potential of the common node CSO and the sensing node SO is decreased to the discharge level in a state in which the common node CSO and the sensing node SO are discharged, and a slope with which the potential is decreased is changed according to the cell current amount. For example, when the cell current amount is relatively large, the potential level of the sensing node SO is discharged at a high speed, and hence the slope is relatively large. When the cell current amount is relatively small, the potential level of the sensing node SO is discharged at a low speed, and hence the slope is relatively small.

The bit line discharge unit 232 is connected to the node ND1 of the bit line controller 231 to discharge a potential level of the bit line BL1.

The bit line discharge unit 232 may include an NMOS transistor N2 connected between the node ND1 and a ground power source VSS, and the NMOS transistor N2 applies the ground power source VSS to the node ND1 in response to a bit line discharge signal BL_DIS.

The sensing node precharge unit 233 is connected between the sensing node SO and the power voltage VDD to precharge the sensing node SO to the level of the power voltage VDD.

The sensing node precharge unit 233 may include a PMOS transistor P3, and the PMOS transistor P3 applies the power voltage VDD to the sensing node SO in response to a sensing node precharge signal PRECHSO_N.

The second latch unit 234 may include a plurality of NMOS transistors N7 to N11 and inverters IV1 and IV2.

The inverters IV1 and IV2 are connected in reverse parallel between the node QS and a node QS_N to constitute a latch. The inverters IV1 and IV2 may be defined as a second latch.

The NMOS transistor N7 and the NMOS transistor N8 are connected in series between the sensing node SO and the ground power source VSS. The NMOS transistor N7 is turned on in response to a transmission signal TRANS, and the NMOS transistor N8 is turned on or turned off according to a potential level of the node QS.

The NMOS transistor N9 is connected between the node QS and a node ND3 to electrically connect the node QS and the node ND3 to each other in response to a reset signal SRST. The NMOS transistor N10 is connected between the node QS_N and the node ND3 to electrically connect the node QS_N and the node ND3 to each other in response to a set signal SSET. The NMOS transistor N11 is connected between the node ND3 and the ground power source VSS, and is turned on according to a potential of the sensing node SO to electrically connect the node ND3 and the ground power source VSS to each other. For example, when the reset signal SRST is applied with the logic high level to the NMOS transistor N9 in a state in which the sensing node SO is precharged to a high level, the node QS and the node QS_N are respectively initialized to the logic low level and the logic high level. Also, when the set signal SSET is applied with the logic high level to the NMOS transistor N10 in a state in which the sensing node SO is precharged to the high level, the node QS and the node QS_N are respectively set to the logic high level and the logic low level. The node QS may be set to the logic low level in a bit line precharge operation and a data sensing operation in an evaluation period.

The second latch unit 234 may latch read data or verify data, based on the potential level of the sensing node SO in a data latch period after the evaluation period. For example, the second latch unit 234 may latch read data or verify data by maintaining the potential of the node QS_N to the high level or discharging the potential of the node QS_N to a low level in response to the potential of the sensing node SO, which is evaluated based on the cell current after the evaluation period is completed, and the set signal SSET toggled to the high level for a certain time.

The first latch unit 235 may include a plurality of NMOS transistors N12 to N16, a plurality of PMOS transistors P4 and P5, and inverters IV3 and IV4.

The inverters IV3 and IV4 are connected in reverse parallel between a node QM and a node QM_N to constitute a latch. The inverters IV3 and IV4 may be defined as a first latch.

The NMOS transistor N12 and the NMOS transistor N13 are connected in series between the sensing node SO and the ground power source VSS. The NMOS transistor N12 is turned on in response to a first transmission signal TRANM, and the NMOS transistor N13 is turned on or turned off according to a potential level of the node QM.

The NMOS transistor N14 is connected between the node QM and a node ND4. The NMOS transistor N14 is turned on or turned off in response to a reset signal MRST. The NMOS transistor N15 is connected between the node QM_N and the node ND4 to electrically connect the node QM_N and the node ND4 to each other in response to a set signal MSET. The NMOS transistor N16 is connected between the node ND4 and the ground power source VSS, and connects the node ND4 and the ground power source VSS to each other according to the potential of the sensing node SO.

The first latch unit 235 may store previous program data programmed in a program operation just before a program operation being currently performed. For example, the first latch unit 235 may store previous program data programmed in a page which is adjacent to a selected page and has been completely programmed. The page buffer 131A may transmit data to be programmed, which is received from the outside and temporarily stored in the program operation just before the current program operation, to the first latch unit 235 after the program operation just before the current program operation is completed and then store the data, or newly receive previous program data from the control logic 140 shown in FIG. 2 and then store the previous program data during the current program operation. For example, when the previous program data is data having a relatively high program state, the first latch unit 235 may set the node QM_N to the logic low level to store the previous program data. When the previous program data is data having a relatively low program state, the first latch unit 235 may set the node QM_N to the logic high level.

Also, the first latch unit 235 may receive specific data from the control logic 140 and then store the specific data. For example, the first latch unit 235 may set the node QM_N to the logic low level to store the specific data.

When the node QM_N is set to the logic low level, the first latch unit 235 may reduce the evaluation period. For example, the bit line controller 231 may adjust the evaluation period as a period in which the evaluation operation is performed according to the data stored in the first latch unit 235. The bit line controller 231 may define, as a first evaluation period, a period from a time at which the precharge signal SA_PRECH_N is changed to the logic high level to a time at which the transmission signal TRANSO is changed to the logic low level. The first latch unit 235 applies the power voltage VDD to the sensing node SO according to a second transmission signal TRANM_N applied with the logic low level before the precharge signal SA_PRECH_N is changed to the logic high level and the potential of the node QM_N having the logic low level. Accordingly, although the precharge signal SA_PRECH_N is changed to the logic high level, the power voltage VDD is continuously applied to the sensing node SO, so that the evaluation operation is not performed. Subsequently, the bit line controller 231 may define, as a second evaluation period, a period from a time at which the second transmission signal TRANM_N is changed to the logic high level to a time at which the transmission signal TRANSO is changed to the logic low level. The second evaluation period may be set shorter than the first evaluation period.

As described above, the page buffer 131A in accordance with the present disclosure may set the evaluation period in the read operation or the program verify operation as the first evaluation period or the second evaluation period shorter than the first evaluation period, based on the data stored in the first latch unit 235.

The page buffer 131A in accordance with the present disclosure may include an additional latch unit (not shown) connected to the sensing node SO. The additional latch unit may receive data to be programmed in the program operation, temporarily store the received data, and then transmit the temporarily stored data to the second latch unit 234. In addition, the temporarily stored data in the additional latch unit may be transmitted to the first latch unit 235 to be stored after the program operation is completed.

Figure 8:
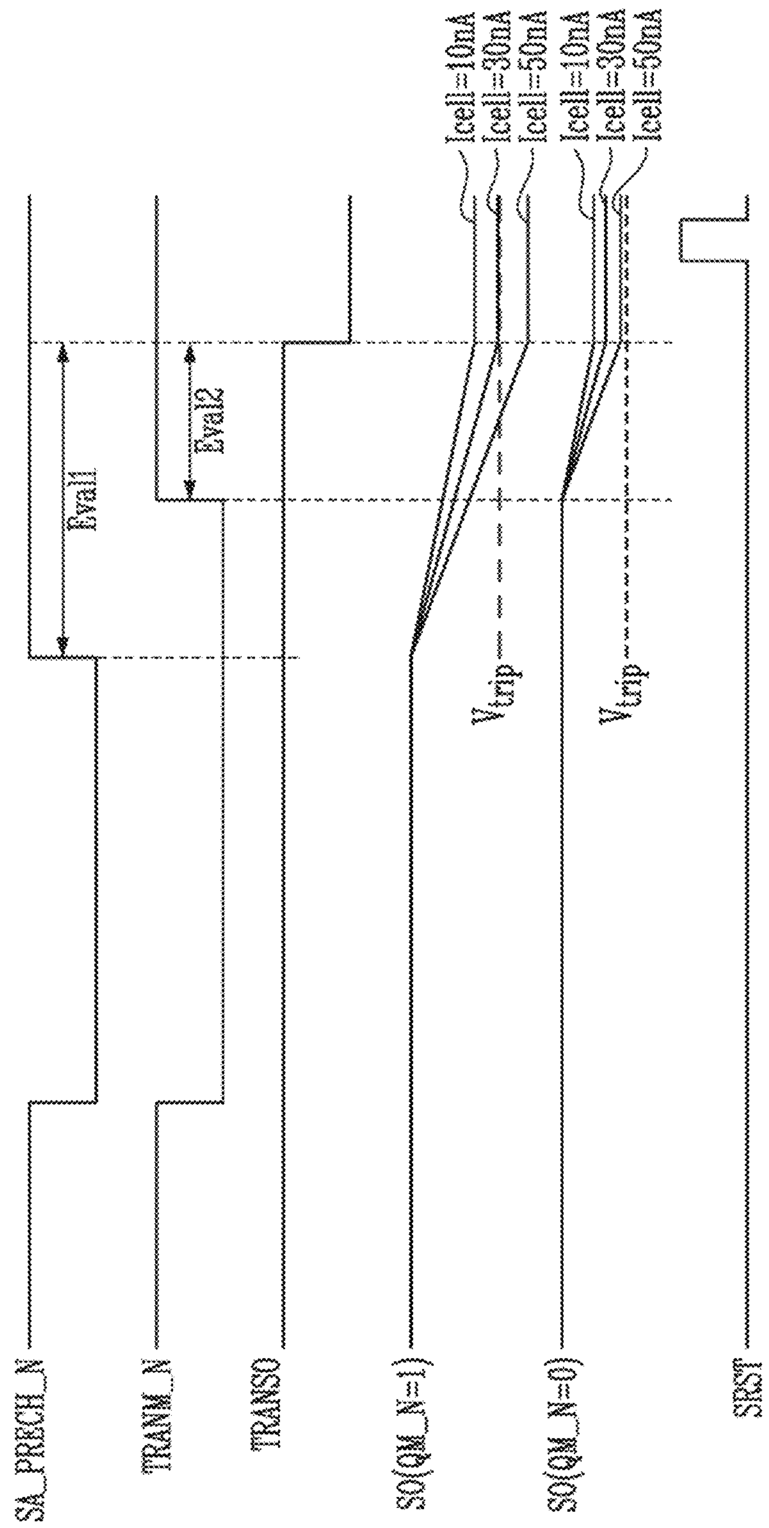
FIG. 8 is a waveform diagram of signals, illustrating a method for adjusting an evaluation period in a program verify operation of the page buffer.

FIG. 8 is a waveform diagram of signals, illustrating a method for adjusting the evaluation period in the program verify operation of the page buffer.

A method for adjusting the evaluation period in the data sensing operation during the read operation or the program verify operation will be described as follows with reference to FIGS. 7 and 8.

1) Method for Setting Evaluation Period as First Period Eval1

The first latch unit 235 of the page buffer 131A sets the logic level of the node QM_N to be logic high (QM_N=1).

For example, the first latch unit 235 is initialized such that the logic level of the node QM_N becomes logic high in an initialization operation. For example, when the reset signal MRST is applied with the logic high level in a state in which the sensing node SO is precharged to the logic high level, the first latch unit 235 is initialized such that the node QM has the logic low level and the node QM_N has the logic high level.

Subsequently, the first latch unit 235 stores previous program data used in a just previous program operation or specific data. When the previous program data corresponds to a relatively low program state (e.g., any one of E and PV1 to PV5 shown in FIG. 6) or when the specific data is data for setting the evaluation period as a first period Eval1, the first latch unit 235 maintains the logic level of the node QM_N to be logic high. For example, the sensing node SO is controlled to have the logic low level, based on the previous program data or the specific data, so that the NMOS transistor N16 is turned off. Accordingly, although the set signal MSET is applied with the logic high level, the node QM_N maintains an initialization state, i.e., the logic high level.

The PMOS transistor P1 and the PMOS transistor P2 of the page buffer 131A precharges the sensing node SO to the level of the power voltage VDD in response to the node QS of the second latch unit 234, which is set to the logic low level, and the precharge signal SA_PRECH_N having the logic low level. The NMOS transistor N5 is turned on in response to the transmission signal TRANSO having the logic high level, and the common node CSO is precharged to a certain level VDD−Vth.

Subsequently, an evaluation operation is performed in the first evaluation period Eval1 as a period from at a time at which the precharge signal SA_PRECH_N is changed to the logic high level to a time at which the transmission signal TRANSO is changed to the logic low level. The PMOS transistor P2 is turned off in response to the precharge signal SA_PRECH_N changed to the logic high level, and the power voltage VDD applied to the sensing node SO is interrupted. The potential level of the sensing node SO and the common node CSO is changed according to the program state of the memory cell connected to the bit line BL1. For example, there occurs a cell current Icell according to the program state of the memory cell or the read voltage or verify voltage applied to the memory cell, and the slope with which the sensing node SO is discharged based on the cell current Icell is changed. Therefore, after the first evaluation period Eval1 is ended, the potential level of the sensing node SO may be determined according to the cell current Icell. Subsequently, the second latch unit 234 may latch data corresponding to the potential of the sensing node SO in response to the reset signal SRST. For example, when the potential of the sensing node SO is higher than a reference voltage Vtrip, the second latch unit 234 may latch data having a first data value. When the potential of the sensing node SO is lower than the reference voltage Vtrip, the second latch unit 234 may latch data having a second data value.

2) Method for Setting Evaluation Period as Second Period Eval2

The first latch unit 235 of the page buffer 131A sets the logic level of the node QM_N to be logic low (QM_N=0).

For example, the first latch unit 235 is initialized such that the logic level of the node QN_N becomes logic high in the initialization operation. For example, when the reset signal MRST is applied with the logic high level in a state in which the sensing node SO is precharged to the logic high level, the first latch unit 235 is initialized such that the node QM has the logic low level and the node QM_N has the logic high level.

Subsequently, the first latch unit 235 stores previous program data used in a just previous program operation or specific data. When the previous program data corresponds to a relatively high program state (e.g., any one of PV6 and PV7 shown in FIG. 6) or when the specific data is data for setting the evaluation period as a second period Eval2, the first latch unit 235 sets the logic level of the node QM_N to be logic low. For example, the sensing node SO is controlled to have the logic high level, based on the previous program data or the specific data, so that the NMOS transistor N16 is turned on. Accordingly, when the set signal MSET is applied with the logic high level, the node QM_N is set to be changed from the logic high level to the logic low level.

The PMOS transistor P1 and the PMOS transistor P2 of the page buffer 131A precharges the sensing node SO to the level of the power voltage VDD in response to the node QS of the second latch unit 234, which is set to the logic low level, and the precharge signal SA_PRECH_N having the logic low level. The NMOS transistor N5 is turned on in response to the transmission signal TRANSO having the logic high level, and the common node CSO is precharged to a certain level VDD−Vth.

The first latch unit 235 applies the power voltage VDD to the sensing node SO according to the second transmission signal TRANM_N applied with the logic low level before the precharge signal SA_PRECH_N is changed to the logic high level and the potential of the node QM_N, which has the logic low level. Accordingly, although the precharge signal SA_PRECH_N is changed to the logic high level, the power voltage VDD is continuously applied to the sensing node SO, so that the evaluation operation is not performed. Subsequently, the evaluation operation is performed in the second evaluation period Eval2 as a period from a time at which the second transmission signal TRANM_N is changed to the logic high level to a time at which the transmission signal TRANSO is changed to the logic low level. The PMOS transistor P2 is turned off in response to the precharge signal SA_PRECH_N changed to the logic high level, and the PMOS transistor P4 is turned off when the transmission signal TRANSO is changed to the logic low level. Therefore, the power voltage VDD applied to the sensing node SO is interrupted. The potential level of the sensing node SO and the common node CSO is changed according to a program state of the memory cell connected to the bit line BL1. For example, there occurs a cell current Icell according to the program state of the memory cell or the read voltage or verify voltage applied to the memory cell, and the slope with which the sensing node SO is discharged based on the cell current Icell is changed. Therefore, after the second evaluation period Eval2 is ended, the potential level of the sensing node SO may be determined according to the cell current Icell. The second evaluation period Eval2 is shorter than the first evaluation period Eval1. Accordingly, after the second evaluation period Eval2 is ended, the potential level of the sensing node SO may be relatively higher than that of the sensing node SO after the first evaluation period Eval1 is ended. That is, the time for which the potential level of the sensing node SO is discharged becomes shorter as the evaluation period becomes shorter. Therefore, the potential of the sensing node SO may be evaluated at the same level as when the read voltage or the verify voltage, which is applied to the memory cell, becomes relatively low.

Subsequently, the second latch unit 234 may latch data corresponding to the potential of the sensing node SO in response to the reset signal SRST. For example, when the potential of the sensing node SO is higher than the reference voltage Vtrip, the second latch unit 234 may latch data having the first data value. When the potential of the sensing node SO is lower than the reference voltage Vtrip, the second latch unit 234 may latch data having the second data value.

Figure 9:
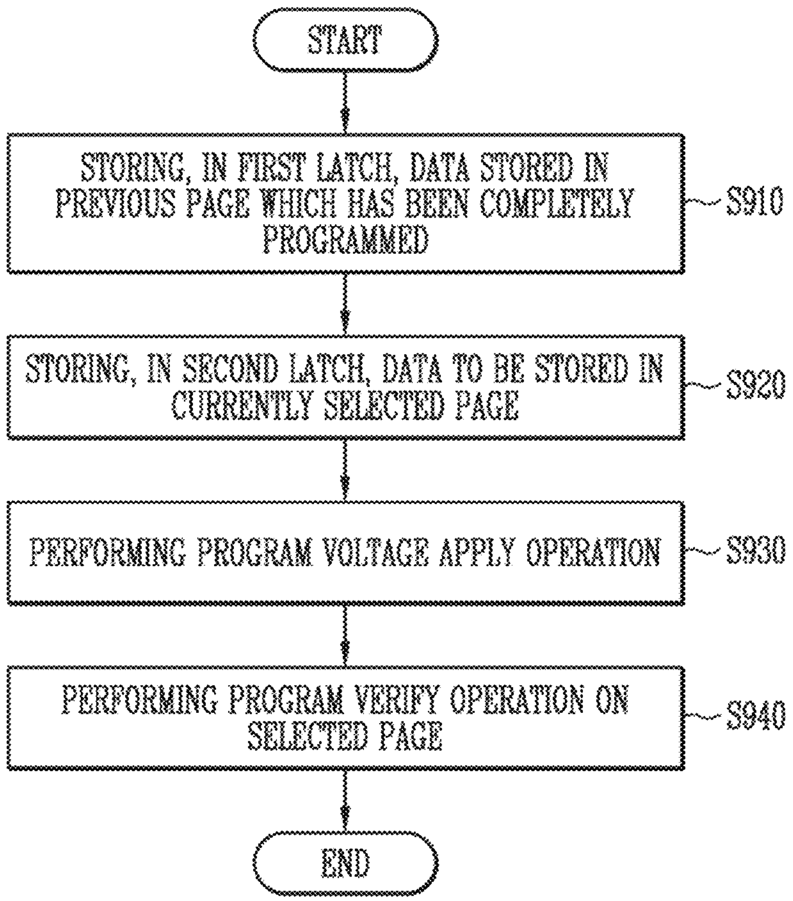
FIG. 9 is a flowchart illustrating a program operation of a semiconductor memory in accordance with an embodiment of the present disclosure.

FIG. 9 is a flowchart illustrating a program operation of a semiconductor memory in accordance with an embodiment of the present disclosure.

Figure 10:
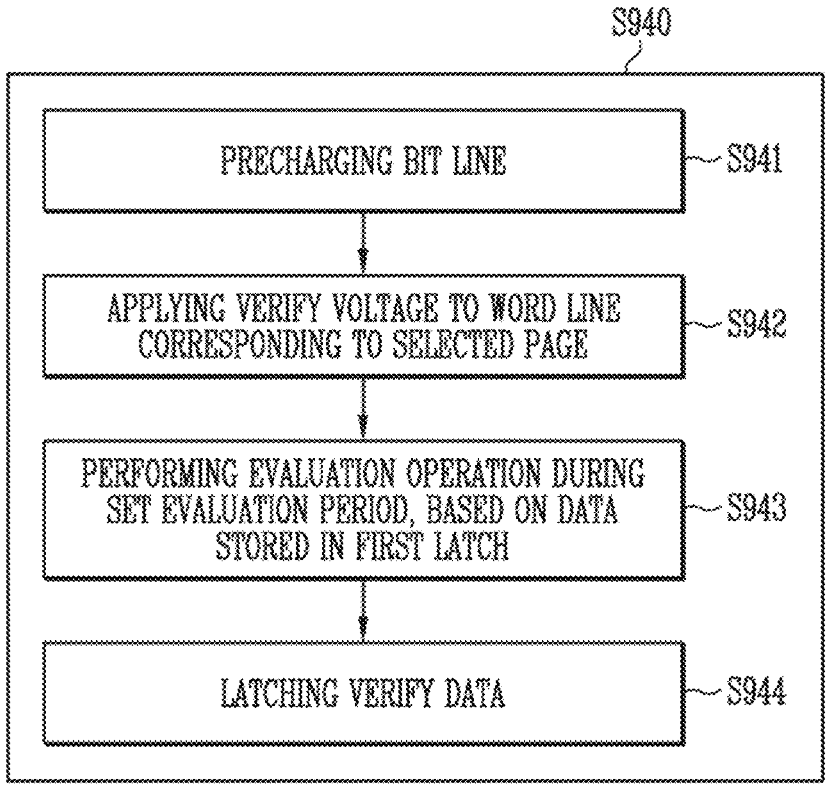
FIG. 10 is a flowchart illustrating in more detail the step of performing a program verify operation, which is shown in FIG. 9.

FIG. 10 is a flowchart illustrating in more detail step S940 of performing a program verify operation, which is shown in FIG. 9.

The program operation of the semiconductor memory in accordance with the embodiment of the present disclosure will be described as follow with reference to FIGS. 2 to 10.

In the program operation of the semiconductor memory in accordance with the embodiment of the present disclosure, pages respectively corresponding to a plurality of word lines WL1 to WLn are sequentially programmed. For example, after a program operation on a page corresponding to the word line WL1, a program operation on a page corresponding to the word line WL2 may be performed. Subsequently, a program operation on a page corresponding to the word line WL3 may be performed.

In this embodiment, a program operation of memory cells F2 included in the page corresponding to the word line WL2 adjacent to the word line WL1 after a program operation of memory cells F1 included in the page corresponding to the word line WL1 is completed will be described as an example.

In step S910, the page buffers PB1 to PBm of the read/write circuit 130 store, in the first latch of the first latch unit 235, previous program data programmed in the page corresponding to the programmed word line WL1, which is adjacent to the page corresponding to the selected word line WL2 in a source line direction and is programmed in a previous program operation, i.e., data stored in a previous page.

The previous program data stored in the previous page may be data temporarily stored in the page buffers PB1 to PBm in a program operation of the previous page. That is, the data temporarily stored in the page buffers PB1 to PBm in the program operation of the previous page may be stored as the previous program data in the first latch of the first latch unit 235.

The logic level of the node QM_N of the first latch may be controlled according to the stored previous data. For example, when the previous program data stored in the first latch corresponds to at least one program state (e.g., PV6 and PV7) having a relatively high threshold voltage distribution among the erase state E and the plurality of program states PV1 to PV7, which are shown in FIG. 6, the node QM_N of the first latch may be controlled to have the logic low level. When the previous program data stored in the first latch corresponds to at least one program state (e.g., PV1 to PV5) having a relatively low threshold voltage distribution among the erase state E and the plurality of program states PV1 to PV7, which are shown in FIG. 6, the node QM_N of the first latch may be controlled to have the logic high level.

That is, when previous program data corresponding to at least one program state PV6 and PV7 having a relatively high threshold voltage distribution is stored in the first latch, the time for which the evaluation operation is performed in the program verify operation is set as the second evaluation period Eval2 in the page buffer. Also, when previous program data corresponding to the erase state E and at least one program state PV1 to PV5, which have a relatively low threshold voltage distribution, is stored in the first latch, the time for which the evaluation operation is performed in the program verify operation is set as the first evaluation period Eval1 longer than the second evaluation period Eval2 in the page buffer.

In step S920, data to be stored in a page corresponding to the word line WL2 selected in a current program operation is received and then stored in the second latch of the second latch unit 234 of each of the plurality of page buffers PB1 to PBm. Each of the plurality of page buffers PB1 to PBm may control a corresponding bit line among the bit lines BL1 to BLm to have a program allow voltage level or a program inhibit voltage level, based on the data stored in the second latch unit 234.

In step S930, a program voltage apply operation is performed by applying the program voltage Vpgm to the selected word line WL2.

The voltage generating circuit 150 generates the program voltage Vpgm and the pass voltage Vpass under the control of the voltage generating circuit control signals VG_signals output from the control logic 140. The address decoder 120 applies the program voltage Vpgm generated by the voltage generating circuit 150 to the selected word line WL2, and applies the pass voltage Vpass generated by the voltage generating circuit 150 to the other unselected word lines WL1 and WL3 to WLn.

In step S940, a program verify operation is performed on the selected page corresponding to selected word line WL2.

The voltage generating circuit 150 generates the verify voltage Vverify and the pass voltage Vpass under the control of the voltage generating circuit control signals VG_signals output from the control logic 140. The address decoder 120 applies the verify voltage Vverify generated by the voltage generating circuit 150 to the selected word line WL2, and applies the pass voltage Vpass generated by the voltage generating circuit 150 to the other unselected word lines WL1 and WL3 to WLn. The plurality of page buffers PB1 to PBm performs the program verify operation by sensing a current amount of the bit lines BL1 to BLm. The plurality of verify voltages $V_{PV1}$ to $V_{PV7}$ respectively corresponding to the plurality of program states PV1 to PV7 may be sequentially applied in the program verify operation, and the plurality of page buffers PB1 to PBm may sense a current amount of the bit lines BL1 to BLm whenever each of the plurality of verify voltages $V_{PV1}$ to $V_{PV7}$ is applied.

The step S940 will be described in more detail, with respect to FIG. 10, as follows.

In step S941, the plurality of page buffers PB1 to PBm precharges the bit lines BL1 to BLm to a set level.

In step S942, the address decoder 120 applies a verify voltage (e.g., $V_{PV1}$) generated by the voltage generating circuit 150 to the selected word line WL2, and applies the pass voltage Vpass generated by the voltage generating circuit 150 to the other unselected word lines WL1 and WL3 to WLn.

In step S943, each of the plurality of page buffers PB1 to PBm may perform an evaluation operation of discharging the potential level of the sensing node SO according to a current amount of the corresponding bit line during a set evaluation period, based on the previous program data stored in the first latch.

In step S944, each of the plurality of page buffers PB1 to PBm latches, to the second latch, verify data corresponding to the potential level of the sensing node SO.

Subsequently, the above-described steps S941 to S944 are re-performed by using a next program verify voltage (e.g., $V_{PV2}$).

As described above, in accordance with the embodiment of the present disclosure, the plurality of page buffers PB1 to PBm can adjust the evaluation period, based on the previous program data in the program verify operation. When an adjacent memory cell which has been previously programmed is programmed to a relatively high program state in a program operation of a selected memory cell, the selected memory cell can be programmed to have a threshold voltage higher than a high target threshold voltage level according to interference influence of the adjacent memory cell. In accordance with the embodiment of the present disclosure, when the previous program data corresponds to a relatively high program state, the effect that the verify voltage level is lowered in the program verify operation can be obtained by adjusting the evaluation period to be relatively short. Accordingly, a phenomenon can be improved, in which the memory cell is programmed to a program state higher than the target threshold voltage according to the interference influence of the adjacent memory cell.

Figure 11:
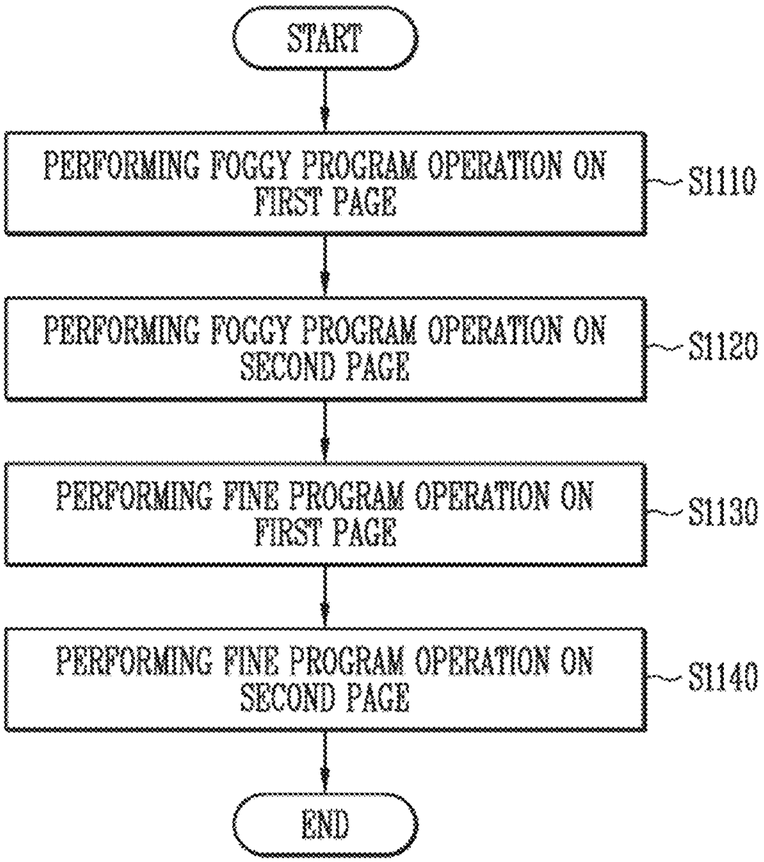
FIG. 11 is a flowchart illustrating a program operation of a semiconductor memory in accordance with another embodiment of the present disclosure.

FIG. 11 is a flowchart illustrating a program operation of a semiconductor memory in accordance with another embodiment of the present disclosure.

Figure 12:
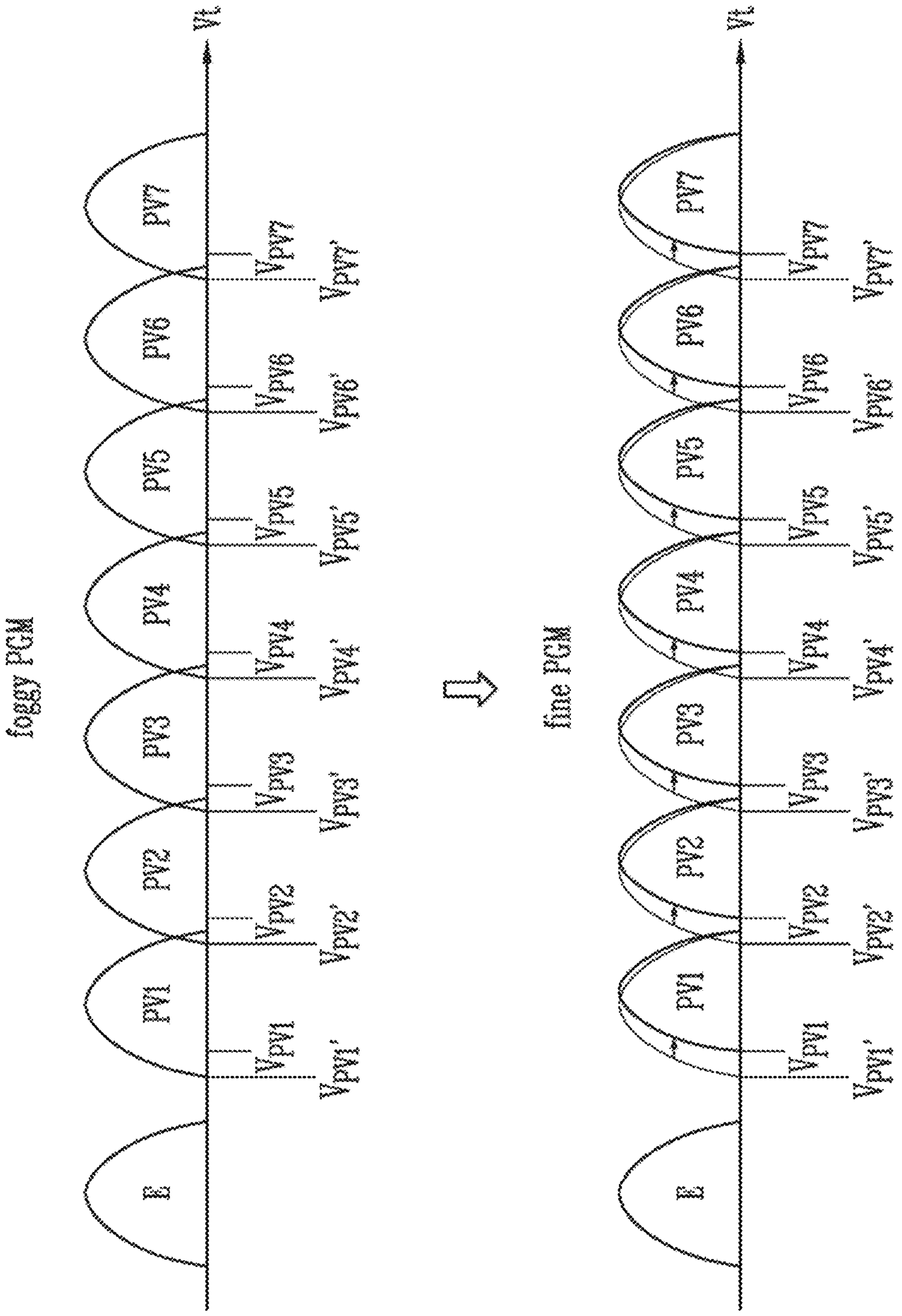
FIG. 12 is a threshold voltage distribution diagram illustrating a threshold voltage distribution of memory cells in a foggy program operation and a fine program operation, which are shown in FIG. 11.

FIG. 12 is a threshold voltage distribution diagram illustrating a threshold voltage distribution of memory cells in a foggy program operation and a fine program operation, which are shown in FIG. 11.

The program operation of the semiconductor memory in accordance with the another embodiment of the present disclosure will be described as follows with reference to FIGS. 2 to 8, 11, and 12.

The program operation of the semiconductor memory in accordance with the another embodiment of the present disclosure may include a foggy program operation and a fine program operation. The foggy program operation is an operation of programming memory cells included in a selected page to have a pre-threshold voltage level lower than a target threshold voltage level, and the fine program operation is an operation of programming the foggy-programmed memory cells included in the selected page to have the target threshold voltage level.

A foggy-fine program operation may be progressed in an order of a foggy program operation on a first page, a foggy program operation on a second page adjacent to the first page, a fine program operation on the first page, a foggy program operation on a third page adjacent to the second page, and a fine program operation on the second page.

In the another embodiment of the present disclosure, a foggy-fine program operation on a first page corresponding to the word line WL1 and a second page corresponding to the word line WL2, which are adjacent to each other, will be described as an example.

In step S1110, a foggy program operation on a first page is performed. For example, the first latch unit 235 of each of the plurality of page buffers PB1 to PBm sets the logic level of the node QM_N to be logic low (QM_N=0). For example, the first latch unit 235 is initialized such that the logic level of the node QN_N becomes logic high in the initialization operation. For example, when the reset signal MRST is applied with the logic high level in a state in which the sensing node SO is precharged to the logic high level, the first latch unit 235 is initialized such that the node QM has the logic low level and the node QM_N has the logic high level. Subsequently, the first latch unit 235 stores specific data, and the specific data may be data for setting the evaluation period as the second period Eval2. For example, the sensing node SO is controlled to have the logic high level, based on the specific data, so that the NMOS transistor N16 is turned on. Accordingly, when the set signal MSET is applied with the logic high level, the node QM_N is set to be changed from the logic high level to the logic low level.

Data to be stored in the first page is received and then stored in the second latch of the second latch unit 234 of each of the plurality of page buffers PB1 to PBm. Each of the plurality of page buffers PB1 to PBm may control a corresponding bit line among the bit lines BL1 to BLm to have a program allow voltage level or a program inhibit voltage level, based on the data stored in the second latch unit 234.

A program voltage apply operation is performed by applying the program voltage Vpgm to the word line WL1 corresponding to the first page. The voltage generating circuit 150 generates the program voltage Vpgm and the pass voltage Vpass under the control of the voltage generating circuit control signals VG_signals output from the control logic 140. The address decoder 120 applies the program voltage Vpgm generated by the voltage generating circuit 150 to the selected word line WL1, and applies the pass voltage Vpass generated by the voltage generating circuit 150 to the other unselected word lines WL2 to WLn.

A program verify operation is performed on the first page. The voltage generating circuit 150 generates the verify voltage Vverify and the pass voltage Vpass under the control of the voltage generating circuit control signals VG_signals output from the control logic 140. The address decoder 120 applies the verify voltage Vverify generated by the voltage generating circuit 150 to the selected word line WL1, and applies the pass voltage Vpass generated by the voltage generating circuit 150 to the other unselected word lines WL2 to WLn. The plurality of page buffers PB1 to PBm performs the program verify operation by sensing a current amount of the bit lines BL1 to BLm. The plurality of verify voltages $V_{PV1}$ to $V_{PV7}$ respectively corresponding to the plurality of program states PV1 to PV7 may be sequentially applied in the program verify operation, and the plurality of page buffers PB1 to PBm may sense a current amount of the bit lines BL1 to BLm whenever each of the plurality of verify voltages $V_{PV1}$ to $V_{PV7}$ is applied. In the program verify operation, each of the plurality of page buffers PB1 to PBm performs an evaluation operation in the second evaluation period Eval2, based on the specific data stored in the first latch. Accordingly, a program verify operation is performed to have a pre-threshold voltage level $V_{PV1'}$ to $V_{PV7'}$ lower than the target threshold voltage level $V_{PV1}$ to $V_{PV7}$ in the program verify operation. Memory cells included in the first page are programmed to the erase state E and the plurality of program states PV1 to PV7, and each of the plurality of program states PV1 to PV7 has a threshold voltage distribution equal to or higher than the pre-threshold voltage level $V_{PV1'}$ to $V_{PV7'}$.

After the foggy program operation on the first page is completed, the data stored in the second latch unit 234 may be moved to the additional latch unit to be stored in the additional latch unit.

In step S1120, a foggy program operation is performed on a second page adjacent to the first page. The foggy program operation on the second page is performed similarly to the above-described foggy program operation on the first page, and therefore, detailed descriptions will be omitted.

In step S1130, a fine program operation is performed on the first page. For example, the first latch unit 235 of each of the plurality of page buffers PB1 to PBm sets the logic level of the node QM_N to be logic high (QM_N=1). For example, the first latch unit 235 is initialized such that the logic level of the node QM_N becomes logic high in an initialization operation. For example, when the reset signal MRST is applied with the logic high level in a state in which the sensing node SO is precharged to the logic high level, the first latch unit 235 is initialized such that the node QM has the logic low level and the node QM_N has the logic high level.

Each of the plurality of page buffers PB1 to PBm may store data to be stored in the first page, which is stored in the additional latch unit, in the second latch of the second latch unit 234. In another embodiment, each of the plurality of page buffers PB1 to PBm may newly receive data to be stored in the first page from the outside (e.g., the control logic 140 or the controller 1200 shown in FIG. 1), and store the newly received data in the second latch of the second latch unit 234. Each of the plurality of page buffers PB1 to PBm may control a corresponding bit line among the bit lines BL1 to BLm to have a program allow voltage level or a program inhibit voltage level, based on the data stored in the second latch unit 234.

A program voltage apply operation is performed by applying the program voltage Vpgm to the word line WL1 corresponding to the first page. The voltage generating circuit 150 generates the program voltage Vpgm and the pass voltage Vpass under the control of the voltage generating circuit control signals VG_signals output from the control logic 140. The address decoder 120 applies the program voltage Vpgm generated by the voltage generating circuit 150 to the selected word line WL1, and applies the pass voltage Vpass generated by the voltage generating circuit 150 to the other unselected word lines WL2 to WLn.

A program verify operation is performed on the first page. The voltage generating circuit 150 generates the verify voltage Vverify and the pass voltage Vpass under the control of the voltage generating circuit control signals VG_signals output from the control logic 140. The address decoder 120 applies the verify voltage Vverify generated by the voltage generating circuit 150 to the selected word line WL1, and applies the pass voltage Vpass generated by the voltage generating circuit 150 to the other unselected word lines WL2 to WLn. The plurality of page buffers PB1 to PBm performs the program verify operation by sensing a current amount of the bit lines BL1 to BLm. The plurality of verify voltages $V_{PV1}$ to $V_{PV7}$ respectively corresponding to the plurality of program states PV1 to PV7 may be sequentially applied in the program verify operation, and the plurality of page buffers PB1 to PBm may sense a current amount of the bit lines BL1 to BLm whenever each of the plurality of verify voltages $V_{PV1}$ to $V_{PV7}$ is applied. In the program verify operation, each of the plurality of page buffers PB1 to PBm performs an evaluation operation in the first evaluation period Eval1, based on the potential of the initialized node QM_N of the first latch. Accordingly, a program verify operation may be performed to have the target threshold voltages $V_{PV1}$ to $V_{PV7}$ in the program verify operation.

The threshold voltage distribution of memory cells included in the second page adjacent to the first page may partially increase in the fine program operation on the first page. However, the memory cells included in the second page are programmed to the pre-threshold voltage level $V_{PV1'}$ to $V_{PV7'}$ lower than the target threshold voltages $V_{PV1}$ to $V_{PV7}$, and thus a problem in that the threshold voltage distribution excessively increases as compared with the target threshold voltage level can be minimized.

In step S1140, a fine program operation is performed on the second page. The fine program operation on the second page is performed similarly to the above-described fine program operation on the first page, and therefore, detailed descriptions will be omitted.

As described above, in the program operation in accordance with the another embodiment of the present disclosure, the plurality of page buffers perform the evaluation operation during the second evaluation period in the foggy program operation, so that the program operation can be performed to have the pre-threshold voltage level lower than the target threshold voltage level. Also, the plurality of page buffers performs the evaluation operation during the first evaluation period in the fine program operation, so that the program operation can be performed to have the target threshold voltage level.

Figure 13:
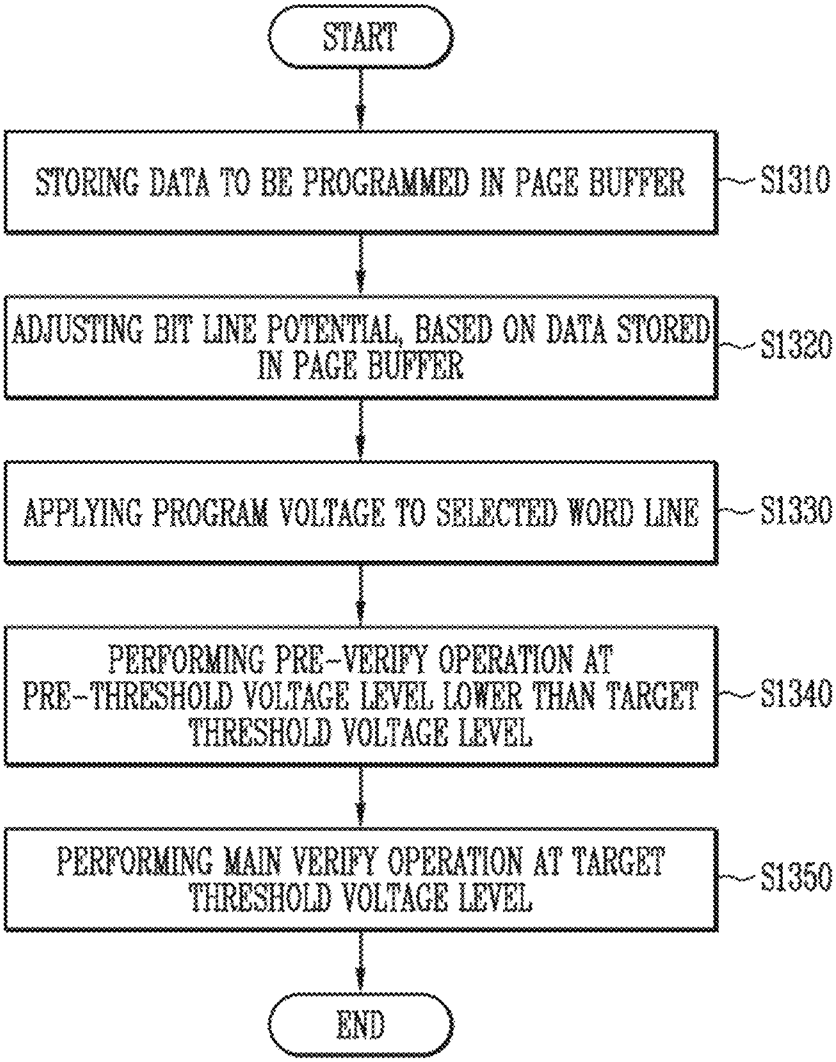
FIG. 13 is a flowchart illustrating a program operation of a semiconductor memory in accordance with still another embodiment of the present disclosure.

FIG. 13 is a flowchart illustrating a program operation of a semiconductor memory in accordance with still another embodiment of the present disclosure.

The program operation of the semiconductor memory in accordance with the still another embodiment of the present disclosure will be described as follows with reference to FIGS. 2 to 8 and 13.

In the program operation of the semiconductor memory in accordance with the still another embodiment of the present disclosure, a pre-verify operation is performed on memory cells included in a selected page to have a pre-threshold voltage level, and page buffers corresponding to memory cells determined as pass, based on a result of the pre-verify operation, increase, by a certain level, the potential level of the bit line to the level of the program allow voltage in a program voltage apply operation performed subsequently.

In step S1310, the plurality of page buffers PB1 to PBm receive data to be stored in a selected page and then store the received data in the second latch of the second latch unit 234.

Also, the first latch unit 235 of each of the plurality of page buffers PB1 to PBm sets the logic level of the node QM_N to be logic low (QM_N=0). For example, the first latch unit 235 is initialized such that the logic level of the node QN_N becomes logic high in the initialization operation. For example, when the reset signal MRST is applied with the logic high level in a state in which the sensing node SO is precharged to the logic high level, the first latch unit 235 is initialized such that the node QM has the logic low level and the node QM_N has the logic high level. Subsequently, the first latch unit 235 stores specific data, and the specific data may be data for setting the evaluation period as the second period Eval2. For example, the sensing node SO is controlled to have the logic high level, based on the specific data, so that the NMOS transistor N16 is turned on. Accordingly, when the set signal MSET is applied with the logic high level, the node QM_N is set to be changed from the logic high level to the logic low level.

In step S1320, each of the plurality of page buffers PB1 to PBm may control a corresponding bit line among the bit lines BL1 to BLm to have a program allow voltage level or a program inhibit voltage level, based on the data stored in the second latch unit 234. For example, the program allow voltage level may be the level of the ground power source VSS, and the program inhibit voltage level may be the level of the power voltage VDD.

In step S1330, the program voltage Vpgm is applied to a selected word line. For example, the voltage generating circuit 150 generates the program voltage Vpgm and the pass voltage Vpass under the control of the voltage generating circuit control signals VG_signals output from the control logic 140. The address decoder 120 applies the program voltage Vpgm generated by the voltage generating circuit 150 to the selected word line WL1, and applies the pass voltage Vpass generated by the voltage generating circuit 150 to the other unselected word lines WL2 to WLn.

In step S1340, a pre-verify operation is performed on the selected page. The pre-verify operation is performed with a pre-threshold voltage level lower than a target threshold voltage level. For example, the voltage generating circuit 150 generates the program voltage Vpgm and the pass voltage Vpass under the control of the voltage generating circuit control signals VG_signals output from the control logic 140. The address decoder 120 applies the program voltage Vpgm generated by the voltage generating circuit 150 to the selected word line WL1, and applies the pass voltage Vpass generated by the voltage generating circuit 150 to the other unselected word lines WL2 to WLn. The plurality of page buffers PB1 to PBm performs the program verify operation by sensing a current amount of the bit lines BL1 to BLm. The plurality of verify voltages $V_{PV1}$ to $V_{PV7}$ respectively corresponding to the plurality of program states PV1 to PV7 may be sequentially applied in the program verify operation, and the plurality of page buffers PB1 to PBm may sense a current amount of the bit lines BL1 to BLm whenever each of the plurality of verify voltages $V_{PV1}$ to $V_{PV7}$ is applied. In the program verify operation, each of the plurality of page buffers PB1 to PBm performs an evaluation operation in the second evaluation period Eval2, based on the specific data stored in the first latch. Accordingly, the program verify operation may be performed with the pre-threshold voltage level lower than the target threshold voltage level $V_{PV1}$ to $V_{PV7}$ in the pre-verify operation.

In step S1350, a main verify operation is performed on the selected page. The main verify operation is performed with the target threshold voltage level. For example, the plurality of page buffers PB1 to PBm may sense a current amount of the bit lines BL1 to BLm whenever each of the plurality of verify voltages $V_{PV1}$ to $V_{PV7}$ is applied. In the program verify operation, each of the plurality of page buffers PB1 to PBm performs an evaluation operation in the first evaluation period Eval1. For example, the control logic 140 controls each of the plurality of page buffers PB1 to PBm to perform the evaluation operation during the first evaluation period Eval1 by applying the second transmission signal TRANM_N with the logic high level in the main verify operation. Accordingly, the program verify operation may perform with the target threshold voltage level $V_{PV1}$ to $V_{PV7}$ in the main verify operation.

A page buffer corresponding to a memory cell determined as pass, based on a result of the pre-program operation applies a voltage higher than the program allow voltage to a corresponding bit line, and a page buffer corresponding to a memory cell determined as pass, based on a result of the main program operation applies the program inhibit voltage to a corresponding bit line. Subsequently, the above-described steps S1330 to S1350 are repeatedly performed.

As described above, in the program operation of the semiconductor memory in accordance with the still another embodiment of the present disclosure, the plurality of page buffers can perform the pre-verify operation by setting the evaluation operation to the second evaluation period, and the main verify operation can be performed by setting the evaluation operation to the first evaluation period.

Figure 14:
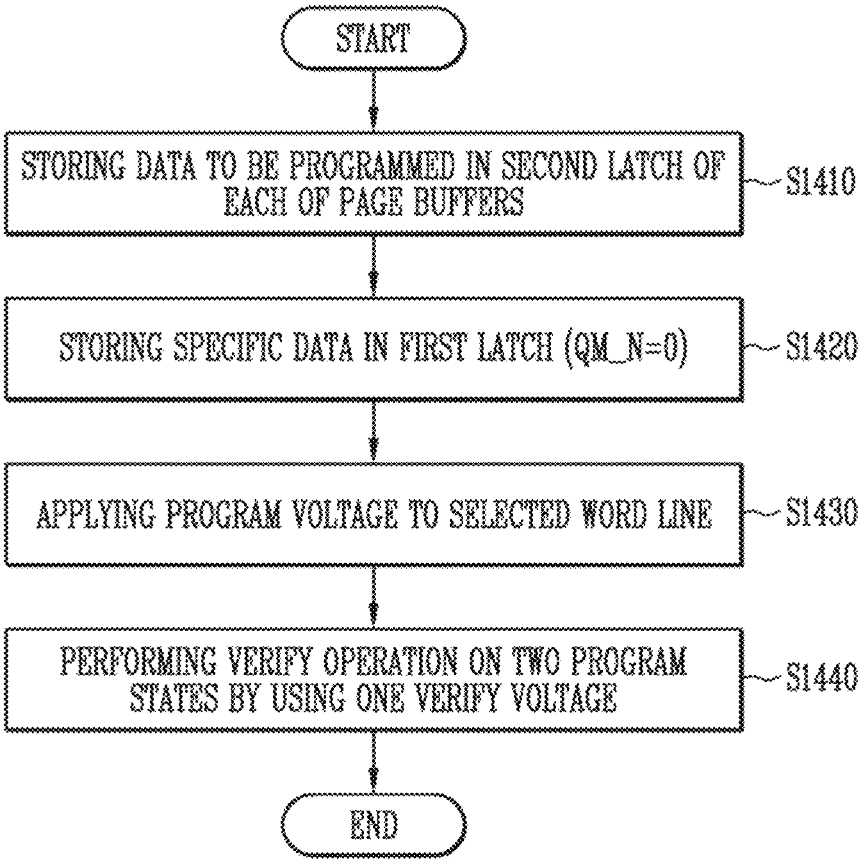
FIG. 14 is a flowchart illustrating a program operation of a semiconductor memory in accordance with still another embodiment of the present disclosure.

FIG. 14 is a flowchart illustrating a program operation of a semiconductor memory in accordance with still another embodiment of the present disclosure.

Figure 15:
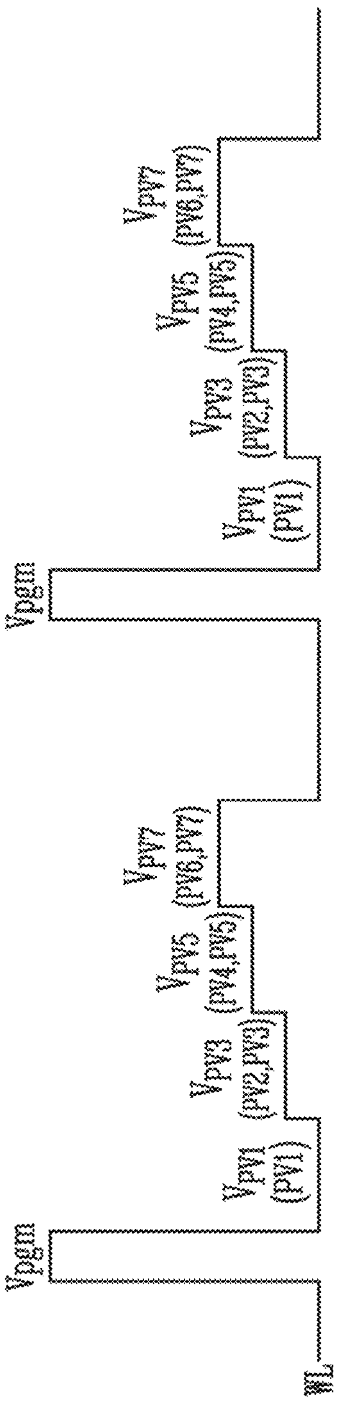
FIG. 15 is a waveform diagram of program and verify voltages, illustrating a multi-sensing operation of a program voltage apply operation and a program verify operation.

FIG. 15 is a waveform diagram of program and verify voltages, illustrating a multi-sensing operation of a program voltage apply operation and a program verify operation.

The program operation of the semiconductor memory in accordance with the still another embodiment of the present disclosure will be described as follows with reference to FIGS. 2 to 8, 14, and 15.

A method for verifying two program states adjacent to each other by using one verify voltage in the program operation of the semiconductor memory in accordance with the still another embodiment of the present disclosure will be described as an example.

In step S1410, data to be programmed in a selected page is stored in the second latch of the second latch unit 234 of the plurality of page buffers PB1 to PBm. Each of the plurality of page buffers PB1 to PBm may control a corresponding bit line among the bit lines BL1 to BLm to have a program allow voltage level or a program inhibit voltage level, based on the data stored in the second latch unit 234.

In step S1420, the first latch unit 235 of each of the plurality of page buffers PB1 to PBm stores specific data in the first latch such that the logic level of the node QM_N becomes logic low. For example, the first latch unit 235 is initialized such that the logic level of the node QN_N becomes logic high in the initialization operation. For example, when the reset signal MRST is applied with the logic high level in a state in which the sensing node SO is precharged to the logic high level, the first latch unit 235 is initialized such that the node QM has the logic low level and the node QM_N has the logic high level. Subsequently, the first latch unit 235 stores specific data, and the specific data may be data for setting the evaluation period as the second period Eval2. For example, the sensing node SO is controlled to have the logic high level, based on the specific data, so that the NMOS transistor N16 is turned on. Accordingly, when the set signal MSET is applied with the logic high level, the node QM_N is set to be changed from the logic high level to the logic low level.

In step S1430, the program voltage Vpgm is applied to a word line WL corresponding to the selected page. For example, the voltage generating circuit 150 generates the program voltage Vpgm and the pass voltage Vpass under the control of the voltage generating circuit control signals VG_signals output from the control logic 140. The address decoder 120 applies the program voltage Vpgm generated by the voltage generating circuit 150 to the selected word line WL, and applies the pass voltage Vpass generated by the voltage generating circuit 150 to the other unselected word lines.

In step S1440, a verify operation on two program states is performed by using one verify voltage.

In a program verify operation, verify operations may be sequentially performed on the plurality of program states PV1 to PV7.

First, a verify operation on the program state PV1 is performed. The voltage generating circuit 150 generates a verify voltage $V_{PV1}$ corresponding to the program state PV1 and the pass voltage Vpass under the control of the voltage generating circuit control signals VG_signals output from the control logic 140. The address decoder 120 applies the verify voltage $V_{PV1}$ generated by the voltage generating circuit 150 to the selected word line, and applies the pass voltage Vpass generated by the voltage generating circuit 150 to the other unselected word lines.

Each of the plurality of page buffers PB1 to PBm performs an evaluation operation in the first evaluation period Eval1. For example, the control logic 140 controls each of the plurality of page buffers PB1 to PBm to perform the evaluation operation during the first evaluation period Eval1 by applying the second transmission signal TRANM_N with the logic high level in a main verify operation. Accordingly, the verify operation may be performed by using the verify voltage $V_{PV1}$ in the verify operation on the program state PV1.

A verify operation on the program states PV2 and PV3 adjacent to each other is performed. The voltage generating circuit 150 generates a verify voltage $V_{PV3}$ corresponding to the program state PV3 and the pass voltage Vpass under the control of the voltage generating circuit control signals VG_signals output from the control logic 140. The address decoder 120 applies the verify voltage $V_{PV3}$ generated by the voltage generating circuit 150 to the selected word line, and applies the pass voltage Vpass generated by the voltage generating circuit 150 to the other unselected word lines.

Each of the plurality of page buffers PB1 to PBm performs an evaluation operation in the second evaluation period Eval2. Each of the plurality of page buffers PB1 to PBm performs the evaluation operation in the second evaluation period Eval2, based on the specific data stored in the first latch. Accordingly, the verify operation on the program state PV2 may be performed in a state in which the verify voltage $V_{PV3}$ is applied to the word line WL of memory cells. Subsequently, each of the plurality of page buffers PB1 to PBm may perform the verify operation on the program state PV3 by performing the evaluation operation in the first evaluation period Eval1. Accordingly, a verify operation on at least two program states adjacent to each other can be performed by using one verify voltage.

Subsequently, verify operations on the program state PV4 and PV5 and the program states PV6 and PV7 may be performed by using the above-described verify operation method.

After the verify operation on the last program state PV7 is completed, the program apply operation and the program verify operation, which are described above, may be re-performed on memory cells determined as program fail.

In order to perform a verify operation on two program states by using one verify voltage, at least two latch units are used to latch verify data. For example, a different latch unit for latching verify data corresponding to each of the program states PV2 and PV3 is used. The verify data in the verify operation on the program state PV2 in the second evaluation period Eval2 may be latched by using the first latch unit 235, and the verify data in the verify operation on the program state PV3 in the first evaluation period Eval1 may be latched by using the second latch unit 234.

As described above, in accordance with the still another embodiment of the present disclosure, a verify operation on program states adjacent to each other can be performed by using one verify voltage. Thus, an operation of changing the verify voltage is skipped, and accordingly, the time required to perform the program operation can be reduced or minimized.

Figure 16:
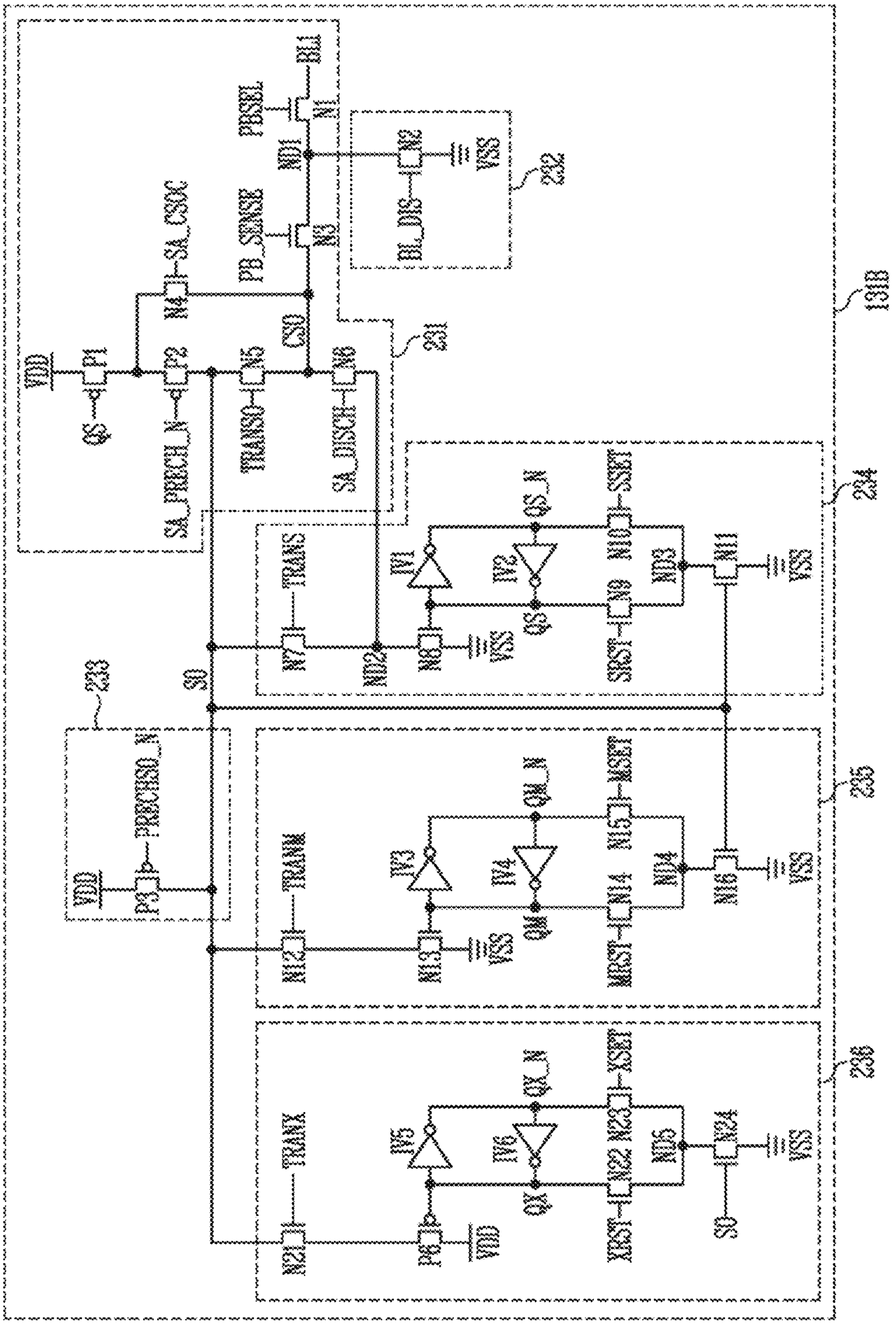
FIG. 16 is a circuit diagram illustrating a page buffer in accordance with another embodiment of the present disclosure.

FIG. 16 is a circuit diagram illustrating a page buffer in accordance with another embodiment of the present disclosure.

A bit line controller 231, a bit line discharge unit 232, a sensing node precharge unit 233, and a second latch unit 234 of the page buffer 131B in accordance with the another embodiment shown in FIG. 16 are configured identically to those of the page buffer 131A shown in FIG. 7.

Hereinafter, for convenience of description, descriptions of the bit line controller 231, the bit line discharge unit 232, the sensing node precharge unit 233, and the second latch unit 234, which are the same components as the page buffer 131A shown in FIG. 7, will be omitted, and a first latch unit

235 and a third latch unit 236, which are components different from those of the page buffer 131A shown in FIG. 7, will be described in detail.

The first latch unit 235 may include a plurality of NMOS transistors N12 to N16 and inverters IV3 and IV4.

The inverters IV3 and IV4 may be connected in reverse parallel between a node QM and a node QM_N to constitute a latch.

The NMOS transistor N12 and the NMOS transistor N13 is connected in series between a sensing node SO and a ground power source VSS. The NMOS transistor N12 is turned on in response to a first transmission signal TRANM, and the NMOS transistor N13 is turned on or turned off according to a potential level of the node QM.

The NMOS transistor N14 is connected between the node QM and a node ND4. The NMOS transistor N14 is turned on or turned off in response to a reset signal MRST. The NMOS transistor N15 is connected between the node QM_N and the node ND4 to electrically connect the node QM_N and the node ND4 to each other in response to a set signal MSET. The NMOS transistor N16 is connected between the node ND4 and the ground power source VSS to connect the node ND4 and the ground power source VSS to each other according to a potential of the sensing node SO.

The first latch unit 235 may be a component corresponding to the additional latch unit described with reference to FIG. 7. For example, the first latch unit 235 may receive program data received from the outside and temporarily store the received program data. The first latch unit 235 may latch verify data or read data in a program verify or read operation.

The third latch unit 236 may include a plurality of NMOS transistors N21 to N24, a PMOS transistor P6, and inverters IV5 and IV6.

The inverters IV5 and IV6 may be connected in reverse parallel between a node QX and QX_N to constitute a latch.

The NMOS transistor N21 and the PMOS transistor P6 are connected between the sensing node SO and a power voltage VDD. The NMOS transistor N21 is turned on in response to a third transmission signal TRANX, and the PMOS transistor P6 is turned on or turned off according to a potential level of the node QX.

The NMOS transistor N22 is connected between the node QX and a node ND5. The NMOS transistor N22 is turned on or turned off in response to a reset signal XRST. The NMOS transistor N23 is connected between the node QX_N and the node ND5 to electrically connect the node QX_N and the node ND5 to each other in response to a set signal XSET. The NMOS transistor N24 is connected between the node ND5 and the ground power source VSS, and connects the node ND5 and the ground power source VSS to each other according to the potential of the sensing node SO.

The third latch unit 236 may be a component corresponding to the first latch unit described with reference to FIG. 7. For example, the third latch unit 236 may store previous program data programmed in a program operation just before a program operation being performed. For example, the third latch unit 236 may store previous program data programmed in a page which is adjacent to a selected page and has been completely programmed. The page buffer 131B may transmit data to be programmed, which is received from the outside and temporarily stored in the program operation just before the current program operation, to the third latch unit 236 after the program operation just before the current program operation is completed and then store the data, or newly receive previous program data from the control logic 140 shown in FIG. 2 and then store the previous program data during the current program operation. For example, when the previous program data is data having a relatively high program state, the third latch unit 236 may set the node QX to the logic low level to store the previous program data. When the previous program data is data having a relatively low program state, the third latch unit 236 may set the node QX to the logic high level. Also, the third latch unit 236 may receive specific data from the control logic 140 and store the specific data. For example, the third latch unit 236 may set the node QX to the logic low level to store the specific data.

When the node QX is set to the logic low level, the third latch unit 236 may reduce the evaluation period. For example, the bit line controller 231 may adjust the evaluation period as a period in which the evaluation operation is performed according to the data stored in the third latch unit 236. The bit line controller 231 may define, as a first evaluation period, a period from at a time at which a precharge signal SA_PRECH_N is changed to the logic high level to a time at which a transmission signal TRANSO is changed to the logic low level. The third latch unit 236 applies the power voltage VDD to the sensing node SO according to a third transmission signal TRANX applied with the logic low level before the precharge signal SA_PRECH_N is changed to the logic high level and the potential of the node QX having the logic low level. Accordingly, although the precharge signal SA_PRECH_N is changed to the logic high level, the power voltage VDD is continuously applied to the sensing node SO, so that the evaluation operation is not performed. Subsequently, the bit line controller 231 may define, as a second evaluation period, a period from a time at which the third transmission signal TRANX is changed to the logic high level to a time at which the transmission signal TRANSO is changed to the logic low level. The second evaluation period may be set shorter than the first evaluation period.

As described above, the page buffer 131B in accordance with the present disclosure may set the evaluation period in the read operation or the program verify operation to the first evaluation period or the second evaluation period shorter than the first evaluation period, based on the data stored in the third latch unit 236.

Figure 17:
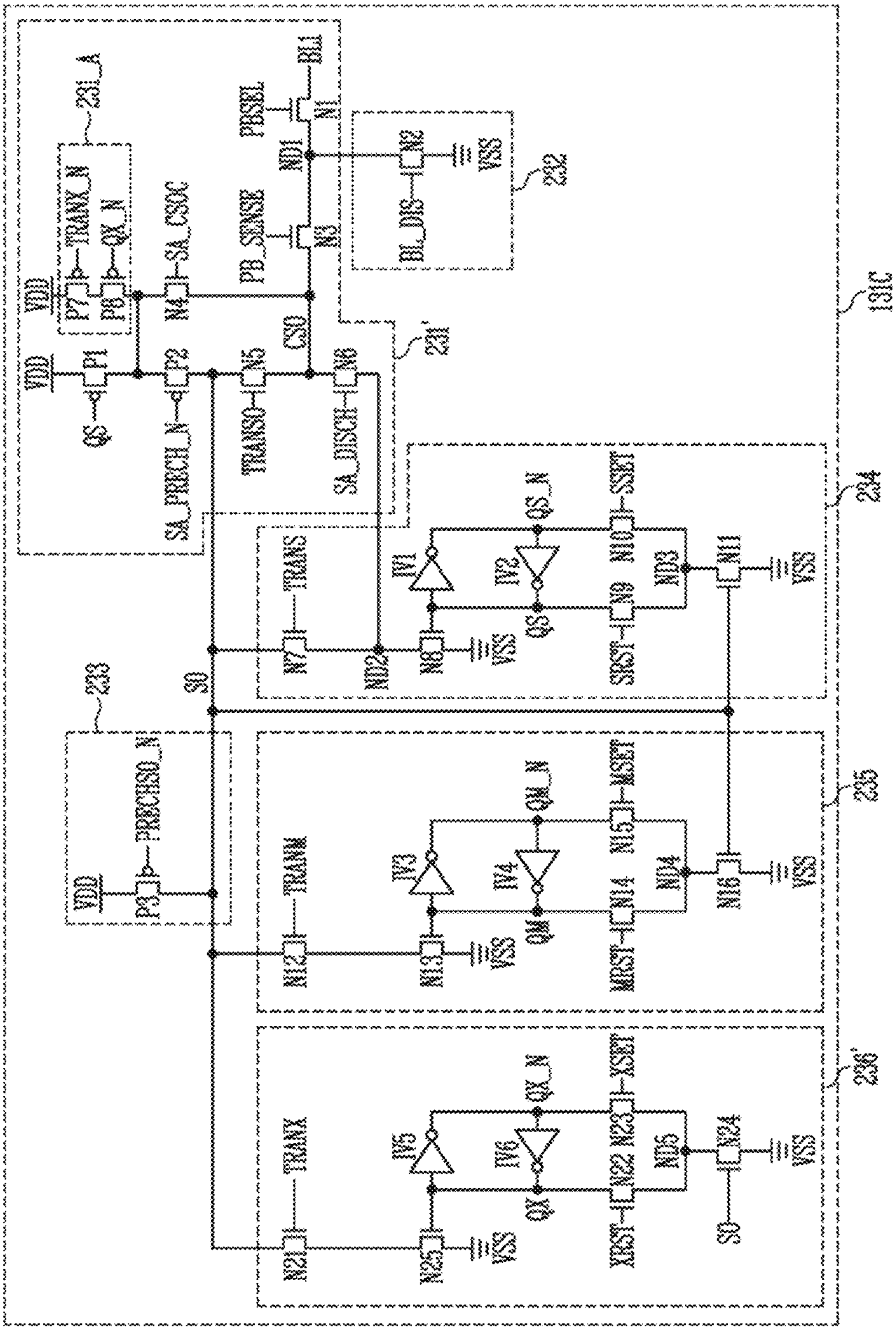
FIG. 17 is a circuit diagram illustrating a page buffer in accordance with still another embodiment of the present disclosure.

FIG. 17 is a circuit diagram illustrating a page buffer in accordance with still another embodiment of the present disclosure.

A bit line discharge unit 232, a sensing node precharge unit 233, a second latch unit 234, and a first latch unit 235 of the page buffer 131C in accordance with the still another embodiment shown in FIG. 17 are configured identically to those of the page buffer 131B shown in FIG. 16.

Hereinafter, for convenience of description, descriptions of the bit line discharge unit 232, the sensing node precharge unit 233, the second latch unit 234, and the first latch unit 235, which are the same components as the page buffer 131B shown in FIG. 16, will be omitted, and a bit line controller 231' and a third latch unit 236', which are components different from those of the page buffer 131B shown in FIG. 16, will be described in detail.

The bit line controller 231' may further include an evaluation period adjustment circuit 231_A in addition to the configuration of the bit line controller 231 shown in FIG. 16.

The bit line controller 231 controls a potential level of a sensing node SO, based on a current amount, i.e., a cell current of a bit line BL1, which is changed according to a program state or a threshold voltage of a memory cell connected to the bit line BL1 in a data sensing operation during a read operation or a program verify operation. Also, the bit line controller 231' may adjust the length of an evaluation period of the page buffer 131C by applying a power voltage VDD to a common node CSO or interrupting the application of the power voltage VDD to the common node CSO, in response to a potential of a node QX_N of the third latch unit 236' and a fourth transmission signal TRANX_N.

The bit line controller 231' may include a plurality of NMOS transistors N1 and N3 to N6, a plurality of PMOS transistors P1 and P2, and the evaluation period adjustment circuit 231_A.

The NMOS transistor N1 is connected between the bit line BL1 and a node ND1, and electrically connects the bit line BL1 and the node ND1 to each other in response to a page buffer select signal PBSEL.

The NMOS transistor N3 is connected between the node ND1 and the common node CSO, and electrically connects the node ND1 and the common node CSO in response to a page buffer sensing signal PB_SENSE.

The PMOS transistor P1 and the PMOS transistor P2 are connected in series between the power voltage VDD and the sensing node SO. Each of the PMOS transistor P1 and the PMOS transistor P2 is turned on in response to a node QS of the sub-latch unit 234 and a precharge signal SA_PRECH_N.

The NMOS transistor N4 is connected between the common node CSO and a node between the PMOS transistor P1 and the PMOS transistor P2, and supplies the power voltage VDD supplied through the PMOS transistor P1 to the common node CSO in response to a control signal SA_CSOC.

The NMOS transistor N5 is connected between the sensing node SO and the common node CSO, and electrically connects the sensing node SO and the common node CSO to each other in response to a transmission signal TRANSO.

The NMOS transistor N6 is connected between the common node CSO and a node ND2 of the sub-latch unit 234, and electrically connects the common node CSO and the node ND2 in response to a discharge signal SA_DISCH.

The evaluation period adjustment circuit 231_A may include PMOS transistors P7 and P8 connected in series between the power voltage VDD and the NMOS transistor N4. In another embodiment, the PMOS transistors P7 and P8 may be connected in series between the power voltage VDD and the common node CSO. The PMOS transistor P7 is turned on or turned off in response to a fourth transmission signal TRANX_N, and the PMOS transistor P8 is turned on or turned off in response to a potential of the QX_N of the third latch unit 236', to apply the power voltage VDD to the common node CSO.

In an evaluation operation, the evaluation period adjustment circuit 231_A may set the evaluation operation to a first evaluation period or set the evaluation operation to a second evaluation period, in response to the potential of the QX_N of the third latch unit 236' and the fourth transmission signal TRANX_N.

The third latch unit 236' may include a plurality of NMOS transistors N21 to N25 and inverters IV5 and IV6.

The inverters IV5 and IV6 may be connected in reverse parallel between a node QX and the node QX_N to constitute a latch.

The NMOS transistor N21 and the NMOS transistor N25 are connected in series between the sensing node SO and a ground power source VSS. The NMOS transistor N21 is turned on in response to a third transmission signal TRANX, and the NMOS transistor N25 is turned on or turned off according to a potential level of the node QX.

The NMOS transistor N22 is connected between the node QX and a node ND5. The NMOS transistor N22 is turned on or turned off in response to a reset signal XRST. The NMOS transistor N23 is connected between the node QX_N and the node ND5 to electrically connect the node QX_N and the node ND5 to each other in response to a set signal XSET. The NMOS transistor N24 is connected between the node ND5 and the ground power source VSS, and connects the node ND5 and the ground power source VSS according to a potential of the sensing node SO.

The third latch unit 236' may be a component corresponding to the third latch unit described with reference to FIG. 16. For example, the third latch unit 236' may store previous program data programmed in a program operation just before a program operation being performed. For example, the third latch unit 236' may store previous program data programmed in a page which is adjacent to a selected page and has been completely programmed. The page buffer 131C may transmit data to be programmed, which is received from the outside and temporarily stored in the program operation just before the current program operation, to the third latch unit 236' after the program operation just before the current program operation is completed and then store the data, or newly receive previous program data from the control logic 140 shown in FIG. 2 and then store the previous program data during the current program operation. For example, when the previous program data is data having a relatively high program state, the third latch unit 236' may set the node QX_N to the logic low level to store the previous program data. When the previous program data is data having a relatively low program state, the third latch unit 236' may set the node QX_N to the logic high level. Also, the third latch unit 236' may receive specific data from the control logic 140 and store the specific data. For example, the third latch unit 236' may set the node QX_N to the logic low level to store the specific data.

When the node QX is set to the logic low level, the third latch unit 236' may reduce the evaluation period. For example, the bit line controller 231' may adjust the evaluation period as a period in which the evaluation operation is performed according to the data stored in the third latch unit 236'. The bit line controller 231' may define, as a first evaluation period, a period from at a time at which a precharge signal SA_PRECH_N is changed to the logic high level to a time at which a transmission signal TRANSO is changed to the logic low level. The third latch unit 236' applies the power voltage VDD to the sensing node SO according to a third transmission signal TRANX applied with the logic low level before the precharge signal SA_PRECH_N is changed to the logic high level and the potential of the node QX having the logic low level. Accordingly, although the precharge signal SA_PRECH_N is changed to the logic high level, the power voltage VDD is continuously applied to the sensing node SO, so that the evaluation operation is not performed. Subsequently, the bit line controller 231' may define, as a second evaluation period, a period from a time at which the third transmission signal TRANX is changed to the logic high level to a time at which the transmission signal TRANSO is changed to the logic low level. The second evaluation period may be set shorter than the first evaluation period.

As described above, the page buffer 131C in accordance with the present disclosure may set the evaluation period in the read operation or the program verify operation to the first evaluation period or the second evaluation period shorter than the first evaluation period, based on the data stored in the third latch unit 236'.

Figure 18:
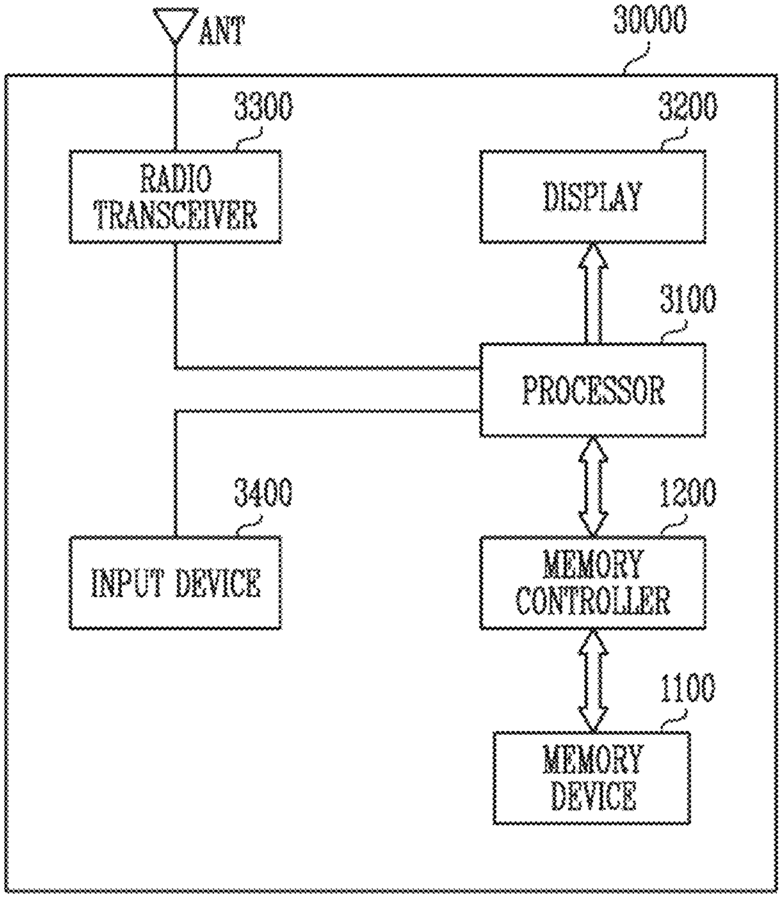
FIG. 18 is a diagram illustrating another embodiment of the memory system.

FIG. 18 is a diagram illustrating another embodiment of the memory system.

Referring to FIG. 18, the memory system 30000 may be implemented as a cellular phone, a smart phone, a tablet PC, a personal digital assistant (PDA), or a wireless communication device. The memory system 30000 may include a memory device 1100 and a memory controller 1200 capable of controlling an operation of the memory device 1100. The memory controller 1200 may control a data access operation of the memory device 1100, e.g., a program operation, an erase operation, a read operation, or the like under the control of a processor 3100.

Data programmed in the memory device 1100 may be output through a display 3200 under the control of the memory controller 1200.

A radio transceiver 3300 may transmit/receive radio signals through an antenna ANT. For example, the radio transceiver 3300 may change a radio signal received through the antenna ANT into a signal that can be processed by the processor 3100. Therefore, the processor 3100 may process a signal output from the radio transceiver 3300 and transmit the processed signal to the memory controller 1200 or the display 3200. The memory controller 1200 may transmit the signal processed by the processor 3100 to the memory device 1100. Also, the radio transceiver 3300 may change a signal output from the processor 3100 into a radio signal, and output the changed radio signal to an external device through the antenna ANT. An input device 3400 is a device capable of inputting a control signal for controlling an operation of the processor 3100 or data to be processed by the processor 3100, and may be implemented as a pointing device such as a touch pad or a computer mount, a keypad, or a keyboard. The processor 3100 may control an operation of the display 3200 such that data output from the memory controller 1200, data output from the radio transceiver 3300, or data output from the input device 3400 can be output through the display 3200.

In some embodiments, the memory controller 1200 capable of controlling an operation of the memory device 1100 may be implemented as a part of the processor 3100, or be implemented as a chip separate from the processor 3100. Also, the memory controller 1200 may be implemented with the controller 1200 shown in FIG. 1.

Figure 19:
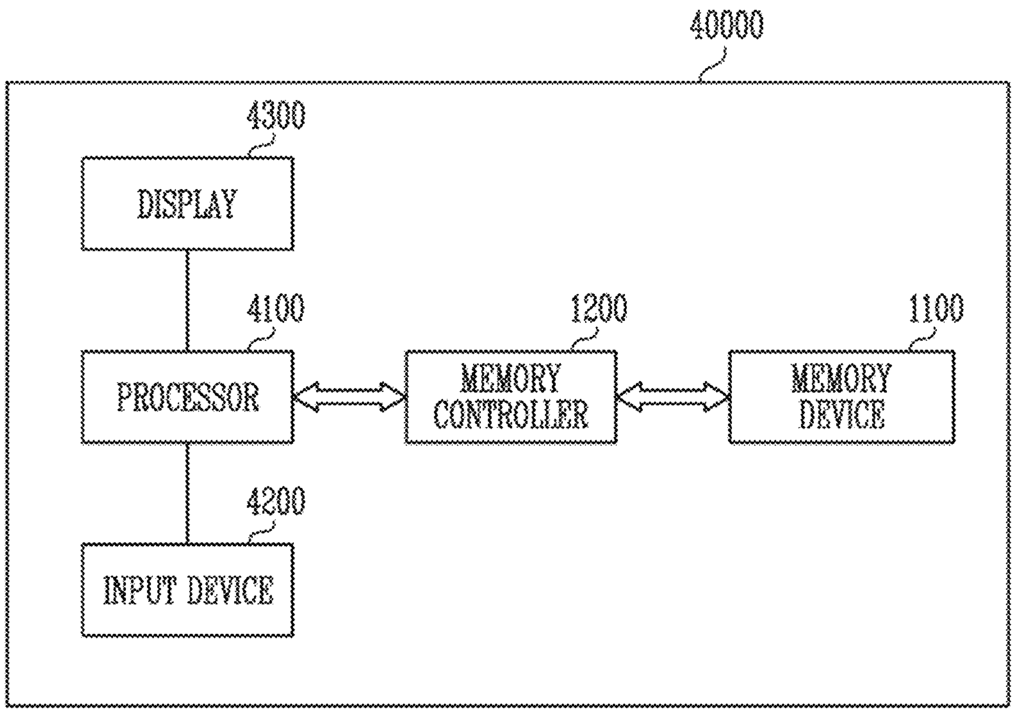
FIG. 19 is a diagram illustrating another embodiment of the memory system.

FIG. 19 is a diagram illustrating another embodiment of the memory system.

Referring to FIG. 19, the memory system 40000 may be implemented as a personal computer (PC), a tablet PC, a net-book, an e-reader, a personal digital assistant (PDA), a portable multi-media player (PMP), an MP3 player, or an MP4 player.

The memory system 40000 may include a memory device 1100 and a memory controller 1200 capable of controlling a data processing operation of the memory device 1100.

A processor 4100 may output data stored in the memory device 1100 through a display 4300 according to data input through an input device 4200. For example, the input device 4200 may be implemented as a pointing device such as a touch pad or a computer mouse, a keypad, or a keyboard.

The processor 4100 may control overall operations of the memory system 40000, and control an operation of the memory controller 1200. In some embodiments, the memory controller 1200 capable of controlling an operation of the memory device 1100 may be implemented as a part of the processor 4100, or be implemented as a chip separate from the processor 4100. Also, the memory controller 1200 may be implemented with the controller 1200 shown in FIG. 1.

Figure 20:
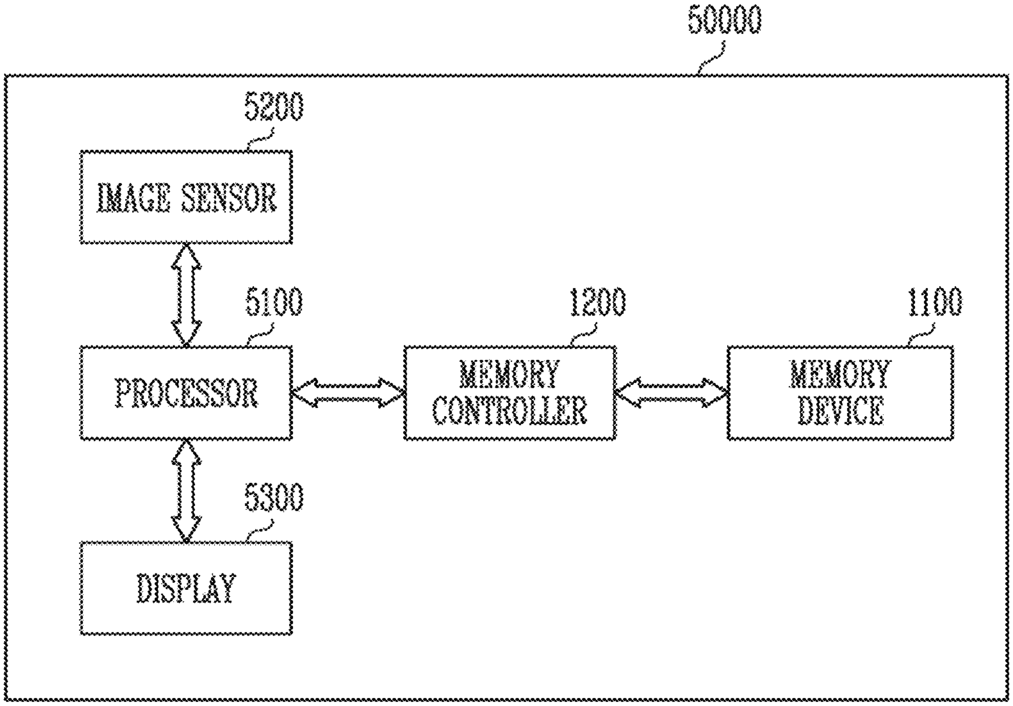
FIG. 20 is a diagram illustrating another embodiment of the memory system.

FIG. 20 is a diagram illustrating another embodiment of the memory system.

Referring to FIG. 20, the memory system 50000 may be implemented as an image processing device, e.g., a digital camera, a mobile terminal having a digital camera attached thereto, a smart phone having a digital camera attached thereto, or a tablet PC having a digital camera attached thereto.

The memory system 50000 may include a memory device 1100 and a memory controller 1200 capable of controlling a data processing operation of the memory device 1100, e.g., a program operation, an erase operation, or a read operation.

An image sensor 5200 of the memory system 50000 may convert an optical image into digital signals, and the converted digital signals may be transmitted to a processor 5100 or the memory controller 1200. Under the control of the processor 5100, the converted digital signals may be output through a display 5300, or be stored in the memory device 1100 through the memory controller 1200. In addition, data stored in the memory device 1100 may be output through the display 5300 under the control of the processor 5100 or the memory controller 1200.

In some embodiments, the memory controller 1200 capable of controlling an operation of the memory device 1100 may be implemented as a part of the processor 5100, or be implemented as a chip separate from the processor 5100. Also, the memory controller 1200 may be implemented with the controller shown in FIG. 1.

Figure 21:
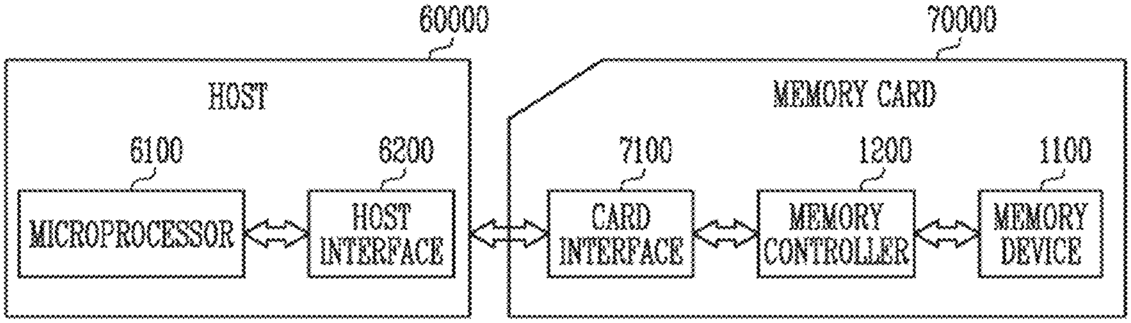
FIG. 21 is a diagram illustrating another embodiment of the memory system.

FIG. 21 is a diagram illustrating another embodiment of the memory system.

Referring to FIG. 21, the memory system 70000 may be implemented as a memory card or a smart card. The memory system 70000 may include a memory device 1100, a memory controller 1200, and a card interface 7100.

The memory controller 1200 may control data exchanged between the memory device 1100 and the card interface 7100. In some embodiments, the card interface 7100 may be a secure digital (SD) card interface or a multi-media card (MMC) interface, but the present disclosure is not limited thereto. Also, the memory controller 1200 may be implemented with the controller 1200 shown in FIG. 1.

The card interface 7100 may interface data exchanged between a host 60000 and the memory controller 1200 according to a protocol of the host 60000. In some embodiments, the card interface 7100 may support a universal serial bus (USB) protocol and an inter-chip (IC)-USB protocol. The card interface 7100 may mean hardware capable of supporting a protocol used by the host 60000, software embedded in the hardware, or a signal transmission scheme.

When the memory system 70000 is coupled to a host interface 6200 of the host 60000 such as a PC, a tablet PC, a digital camera, a digital audio player, a cellular phone, console video game hardware, or a digital set-top box, the host interface 6200 may perform data communication with the memory device 1100 through the card interface 7100 and the memory controller 1200 under the control of a microprocessor 6100.

In accordance with the present disclosure, a time of an evaluation period in a program verify operation of a selected page can be set based on data programmed in a page adjacent to the selected page. Thus, a threshold voltage distribution can be improved by adjusting a verify level of memory cells included in the selected page, and a plurality of program states can be verified in a state in which one verify voltage is applied. Accordingly the time required to perform a program operation can be reduced.

While the present disclosure has been shown and described with reference to certain embodiments thereof, it will be understood by those skilled in the art that various changes in form and detail may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all steps may be selectively performed and/or some of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A semiconductor memory comprising:

a memory block including a plurality of pages; and a read/write circuit including a plurality of page buffers connected to bit lines of the memory block;

wherein the plurality of page buffers is configured to:

store, in a first latch included in each of the plurality of page buffers, previous program data of a page programmed in a just previous program operation or specific data; and set an evaluation period in a program verify operation of a currently selected page set as a first evaluation period or a second evaluation period shorter than the first evaluation period, based on the previous program data or the specific data, which is stored in the first latch unit.

2. The semiconductor memory of claim 1, wherein each of the plurality of page buffers includes:

a bit line controller connected between any one of the bit lines and a sensing node, the bit line controller capable of adjusting a potential level of the sensing node, based on a cell current amount of the bit line, by performing an evaluation operation;

the first latch unit connected to the sensing node, the first latch unit capable of storing the previous program data or the specific data; and a second latch unit configured to latch verify data, based on the potential level of the sensing node.

3. The semiconductor memory of claim 2, wherein the first latch unit is capable of adjusting the evaluation period by applying a power voltage to the sensing node or interrupting the application of the power voltage to the sensing node in the evaluation operation.

4. The semiconductor memory of claim 2, wherein the first latch unit includes:

a latch connected between a first node and a second node, the latch capable of latching the previous program data or the specific data; and a first transistor and a second transistor, connected in series between a power voltage and the sensing node, and wherein the first transistor is capable of being turned on or turned off in response to a transmission signal, and the second transistor is capable of being turned on or turned off in response to a potential of the first node.

5. The semiconductor memory of claim 4, wherein the first latch unit is capable of setting an operation period of the evaluation operation as the second evaluation period shorter than a first evaluation period by applying the power voltage to the sensing node in the evaluation operation, when the first node is controlled to have a logic low level as the previous program data or the specific data is latched by the latch.

6. A method for operating a semiconductor memory, the method comprising:

storing, in a first latch unit of a page buffer, previous program data stored in a previous page which is adjacent to a selected page among a plurality of pages and which has been programmed in a just previous program operation or specific data;

storing data to be programmed in the selected page in a second latch unit of the page buffer;

adjusting a potential level of bit lines connected to the selected page, based on the data stored in the second latch unit and then performing a program voltage apply operation; and performing an evaluation operation of adjusting a potential level of a sensing node of the page buffer, based on a current amount of the bit lines, and then performing a program verify operation of latching verify data corresponding to the potential level of the sensing node, wherein the evaluation operation is performed during an evaluation period set as a first evaluation period or a second evaluation period shorter than the first evaluation period, based on the previous program data or the specific data, which is stored in the first latch unit.

7. The method of claim 6, wherein, in the evaluation operation, the first latch unit sets the evaluation period as the second evaluation period by applying a power voltage to the sensing node, based on the previous program data or the specific data.

8. The method of claim 6, wherein the first latch unit sets the evaluation period as the second evaluation period when the previous program data corresponds to a program state having a relatively high threshold voltage distribution, and sets the evaluation period as the first evaluation period when the previous program data corresponds to a program state having a relatively low threshold voltage distribution.

* * * * *